(12) United States Patent
Lim et al.

(10) Patent No.: US 11,744,066 B2
(45) Date of Patent: *Aug. 29, 2023

(54) SEMICONDUCTOR DEVICES INCLUDING STACK STRUCTURE HAVING GATE REGION AND INSULATING REGION

(71) Applicant: Samsung Electronics Co., Ltd., Suwon-si (KR)

(72) Inventors: Geunwon Lim, Yongin-si (KR); Seokcheon Baek, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 17/685,692

(22) Filed: Mar. 3, 2022

(65) Prior Publication Data
US 2022/0231039 A1    Jul. 21, 2022

Related U.S. Application Data

(63) Continuation of application No. 16/856,560, filed on Apr. 23, 2020, now Pat. No. 11,271,003.

(30) Foreign Application Priority Data

Jul. 18, 2019  (KR) .......................... 10-2019-0086900

(51) Int. Cl.
*H10B 41/27* (2023.01)
*G11C 5/02* (2006.01)
*H01L 29/788* (2006.01)

(52) U.S. Cl.
CPC .............. *H10B 41/27* (2023.02); *G11C 5/025* (2013.01); *H01L 29/788* (2013.01)

(58) Field of Classification Search
CPC ............ H01L 27/11556; H01L 29/788; H01L 27/11582; H01L 27/11575;
(Continued)

(56) References Cited

U.S. PATENT DOCUMENTS

| 8,288,816 B2 | 10/2012 | Komori et al. |
| 8,680,604 B2 | 3/2014 | Higashi et al. |

(Continued)

FOREIGN PATENT DOCUMENTS

| KR | 101049971 B1 | 7/2011 |
| KR | 1020160069584 | 6/2016 |
| KR | 1020180103233 | 9/2018 |

*Primary Examiner* — Allison Bernstein
(74) *Attorney, Agent, or Firm* — Myers Bigel, P.A.

(57) ABSTRACT

A semiconductor device includes a lower structure and a stack structure that extends into a connection region on the lower structure, where the stack structure includes gate pads and mold pads. The mold pads include intermediate mold pads that include first intermediate mold pads and a second intermediate mold pad between a pair of the first intermediate mold pads, each of the first intermediate mold pads has a first length in a first direction, the second intermediate mold pad has a second length in the first direction, greater than the first length, one of the intermediate mold pads includes a mold pad portion and an insulating protrusion portion on the mold pad portion, one of the first intermediate mold pads includes the mold pad portion and the insulating protrusion portion, and a central region of the second intermediate mold pad does not include the insulating protrusion portion.

20 Claims, 28 Drawing Sheets

(58) Field of Classification Search
CPC ......... H01L 27/11517; H01L 27/11521; H01L 27/11551; H01L 21/0217; H01L 21/76829; H01L 21/76837; H01L 21/76841; H01L 21/8234; H01L 29/66825; G11C 5/025; H10B 41/27; H10B 43/27; H10B 43/50; H10B 41/00; H10B 41/20; H10B 41/30

See application file for complete search history.

(56) References Cited

U.S. PATENT DOCUMENTS

| | | |
|---|---|---|
| 8,933,502 B2 | 1/2015 | Higashitani et al. |
| 9,006,884 B2 | 4/2015 | Lee et al. |
| 9,653,562 B2 | 5/2017 | Kim et al. |
| 9,721,663 B1 | 8/2017 | Ogawa et al. |
| 9,985,041 B2 | 5/2018 | Yun et al. |
| 10,229,929 B2 | 3/2019 | Kim et al. |
| 10,276,585 B2 | 4/2019 | Utsumi |
| 11,081,443 B1 | 8/2021 | Mizutani et al. |
| 11,264,387 B2 | 3/2022 | Matsumoto et al. |
| 2010/0109093 A1 | 5/2010 | Weon-Ho |
| 2015/0255385 A1 | 9/2015 | Lee et al. |
| 2017/0179154 A1 | 6/2017 | Furihata et al. |
| 2018/0053686 A1 | 2/2018 | Hyun et al. |
| 2018/0261618 A1 | 9/2018 | Lee et al. |
| 2019/0019807 A1 | 1/2019 | Gu et al. |
| 2019/0043880 A1 | 2/2019 | Lee et al. |
| 2019/0081070 A1 | 3/2019 | Lu et al. |
| 2019/0214404 A1 | 7/2019 | Ahn et al. |
| 2019/0221574 A1 | 7/2019 | Shimabukuro et al. |
| 2021/0020656 A1 | 1/2021 | Kim et al. |
| 2021/0057442 A1 | 2/2021 | Zhang et al. |
| 2021/0151455 A1 | 5/2021 | Xu et al. |
| 2021/0175173 A1* | 6/2021 | Shin .................. H01L 27/11565 |

* cited by examiner

SEMICONDUCTOR DEVICES INCLUDING STACK STRUCTURE HAVING GATE REGION AND INSULATING REGION

CROSS-REFERENCE TO RELATED APPLICATION(S)

This application is a continuation of U.S. patent application Ser. No. 16/856,560, filed Apr. 23, 2020, which application claims benefit of priority under 35 U.S.C. § 119 to Korean Patent Application No. 10-2019-0086900 filed on Jul. 18, 2019, in the Korean Intellectual Property Office, the disclosure of which is incorporated herein by reference in its entirety.

BACKGROUND

Example embodiments of the present inventive concepts relate to semiconductor devices, and more particularly, to semiconductor devices including a stack structure having a gate region and an insulating region.

A semiconductor device including gate electrodes stacked in a direction perpendicular to a surface of a semiconductor substrate has been developed. To improve integration density of a semiconductor device, the number of the stacked gate electrodes has been increased. As the number of the gate electrodes stacked in the direction perpendicular to the surface of the semiconductor substrate has been increased, difficulty in a process of electrically connecting the gate electrodes to a peripheral circuit has increased, and unexpected defects have occurred.

SUMMARY

An example embodiment of the present inventive concepts provides semiconductor devices which may have improved integration density.

According to an example embodiment of the present inventive concepts, a semiconductor device includes a lower structure including a lower substrate, an upper substrate on the lower substrate, a peripheral circuit region between the lower substrate and the upper substrate and including peripheral wirings, and a gap-fill insulating layer penetrating the upper substrate; a stack structure in a memory cell array region on the lower structure and extending into a connection region on the lower structure, wherein the stack structure has a staircase structure in the connection region, the stack structure includes a gate region and a first insulating region, the gate region is in the memory cell array region and extends into the connection region, and the first insulating region is in the connection region; a capping insulating layer on the stack structure; and a memory cell vertical structure in the gate region in the memory cell array region, the stack structure includes a plurality of first layers and a plurality of second layers alternately stacked on the lower structure, the plurality of second layers include a plurality of gate layers in the gate region, a plurality of mold layers in the first insulating region, a plurality of gate pads extending from the plurality of gate layers, and a plurality of mold pads extending from at least one of the mold layers, each of the plurality of gate layers includes a conductive material, each of the plurality of mold layers includes an insulating material, the plurality of mold layers include one or a plurality of lower mold layers, a plurality of intermediate mold layers on the one or the plurality of lower mold layers, and one or a plurality of floating mold layers on the plurality of intermediate mold layers, the plurality of mold pads include a plurality of intermediate mold pads extending from at least one of the plurality of intermediate mold layers, the plurality of intermediate mold pads include a staircase structure descending in a first direction, the first direction extends to the connection region from the memory cell array region, the plurality of intermediate mold pads include a plurality of first intermediate mold pads, and a second intermediate mold pad between a pair of the plurality of first intermediate mold pads, each of the plurality of first intermediate mold pads has a first length in the first direction, the second intermediate mold pad has a second length in the first direction, greater than the first length, at least one of the plurality of intermediate mold pads has a mold pad portion and an insulating protrusion portion on the mold pad, at least one of the plurality of first intermediate mold pads includes the mold pad portion and the insulating protrusion portion, and at least a central region of the second intermediate mold pad does not include the insulating protrusion portion.

According to an example embodiment of the present inventive concepts, a semiconductor device includes a lower structure; a stack structure in a memory cell array region on the lower structure and extending into a connection region on the lower structure, where the stack structure includes a gate region including a plurality of gate pads and an insulating region including a plurality of mold pads; and a memory cell vertical structure penetrating the gate region in the memory cell array region, the plurality of mold pads includes a plurality of intermediate mold pads, the plurality of intermediate mold pads include a plurality of first intermediate mold pads, and a second intermediate mold pad between a pair of the plurality of first intermediate mold pads, each of the plurality of first intermediate mold pads has a first length in a first direction, the second intermediate mold pad has a second length in the first direction, greater than the first length, at least one intermediate mold pad of the plurality of intermediate mold pads includes a mold pad portion and an insulating protrusion portion on the mold pad portion, at least one first intermediate mold pad of the plurality of first intermediate mold pads includes the mold pad portion and the insulating protrusion portion, and at least a central region of the second intermediate mold pad does not include the insulating protrusion portion.

According to an example embodiment of the present inventive concepts, a semiconductor device includes a lower structure including a lower substrate, an upper substrate on the lower substrate, a peripheral circuit region between the lower substrate and the upper substrate and including peripheral wirings, and a gap-fill insulating layer penetrating the upper substrate; a stack structure in a memory cell array region on the lower structure and extending into a connection region on the lower structure, where the stack structure includes a gate region and an insulating region, the gate region is in the memory cell array region and extends into the connection region, and the first insulating region is in the connection region; a memory cell vertical structure penetrating the gate region in the memory cell array region; and a capping insulating layer on the stack structure, the stack structure includes a plurality of first layers and a plurality of second layers alternately stacked on the lower structure, the plurality of first layers comprise interlayer insulating layers, the plurality of second layers include a plurality of gate layers in the gate region, a plurality of mold layers in the insulating region, a plurality of gate pads extending from the gate layers, and a plurality of mold pads extending from at least some of the mold layers, the plurality of mold pads include a plurality of intermediate mold pads, the plurality of intermediate mold pads include a plurality of first intermediate mold pads and a second intermediate mold pad between a pair of the plurality of first intermediate mold pads, each of the plurality of first intermediate mold pads has a first length in a first direction, the second intermediate mold pad has a second length in the first direction, greater than the first length, the first direction extends to the connection region from the memory cell array region, and at least one of the plurality of first intermediate mold pads has a first thickness, and a central region of the second intermediate mold pad includes an insulating material layer having a second thickness less than the first thickness, or the central region of the second intermediate mold pad comprises the capping insulating layer.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, embodiments of the present inventive concepts will be described with reference to the accompanying drawings.

Figure 1:
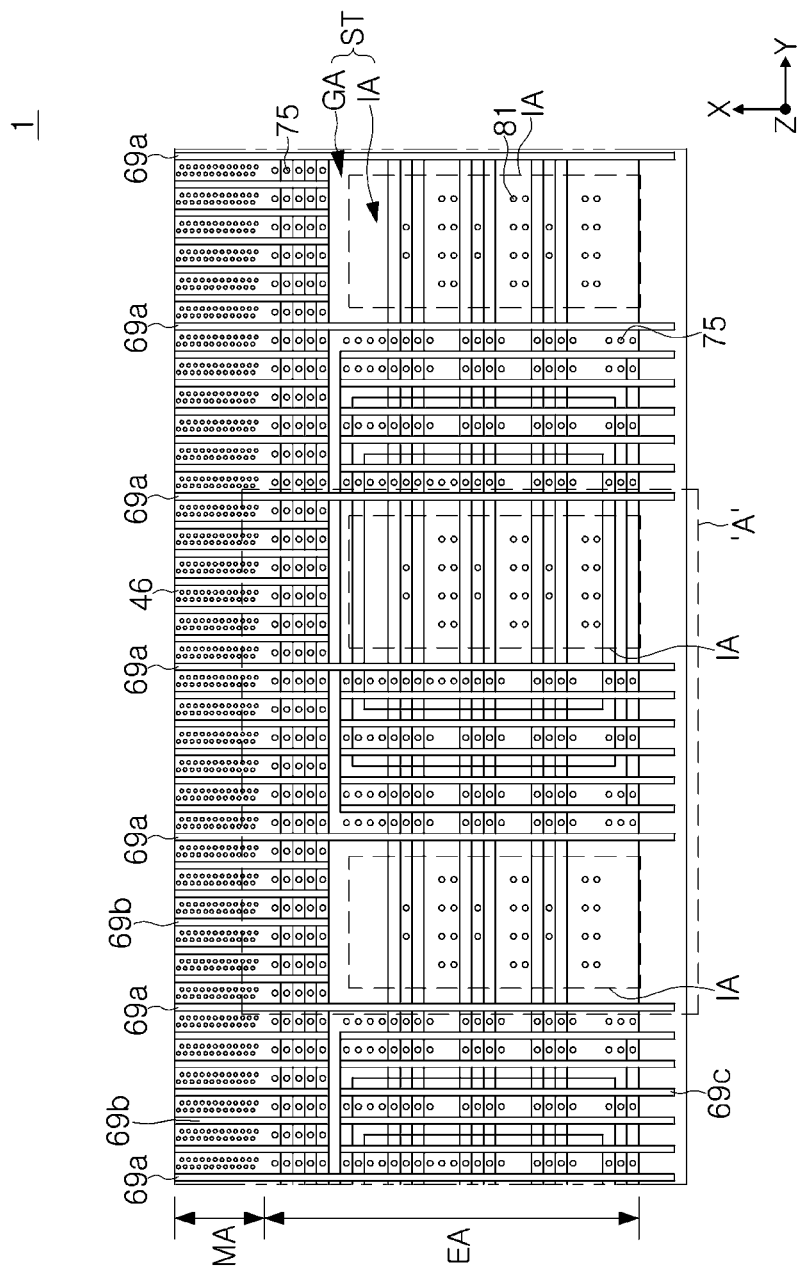
FIG. 1 is a plan diagram illustrating a semiconductor device according to an example embodiment of the present inventive concepts.
Figure 2:
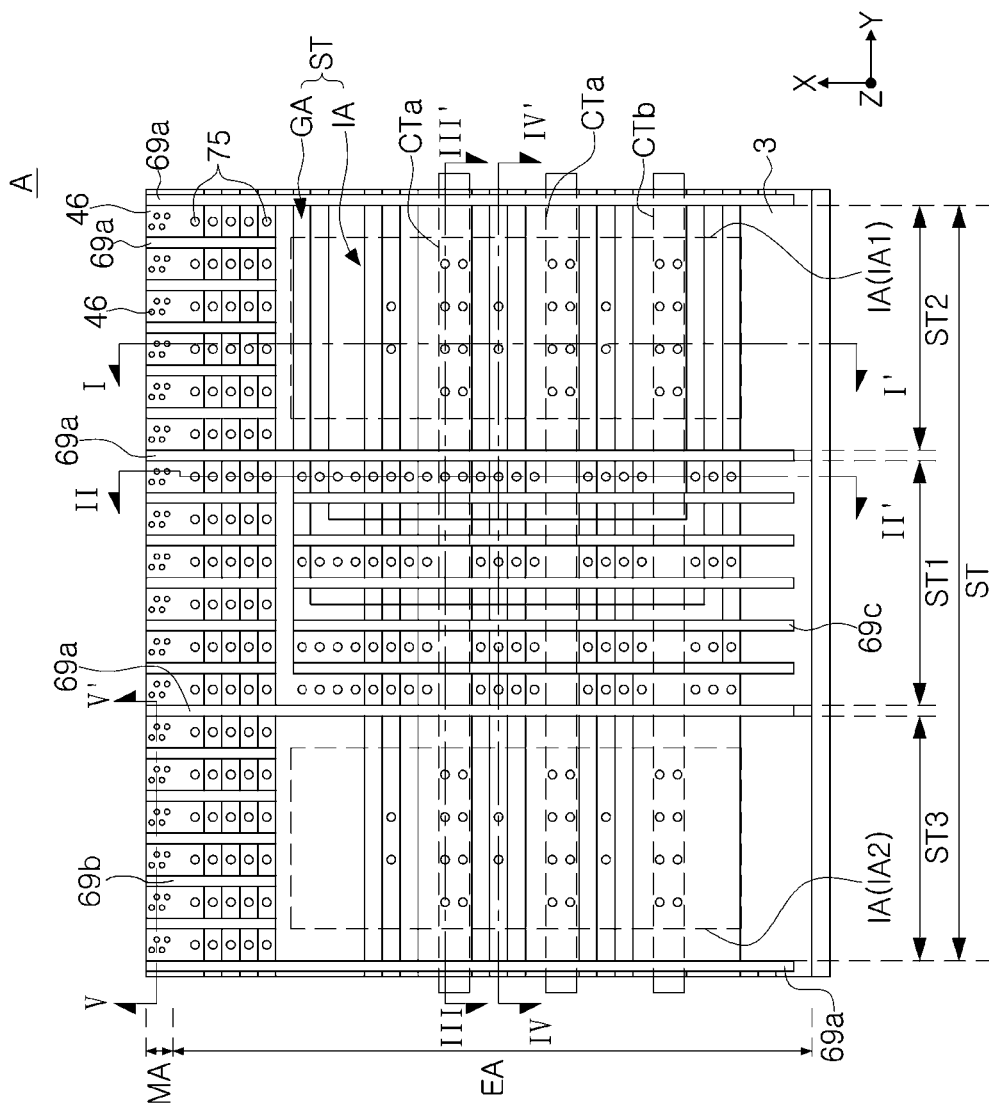
FIG. 2 is an enlarged plan diagram illustrating portion "A" illustrated in FIG. 1.
Figure 3:
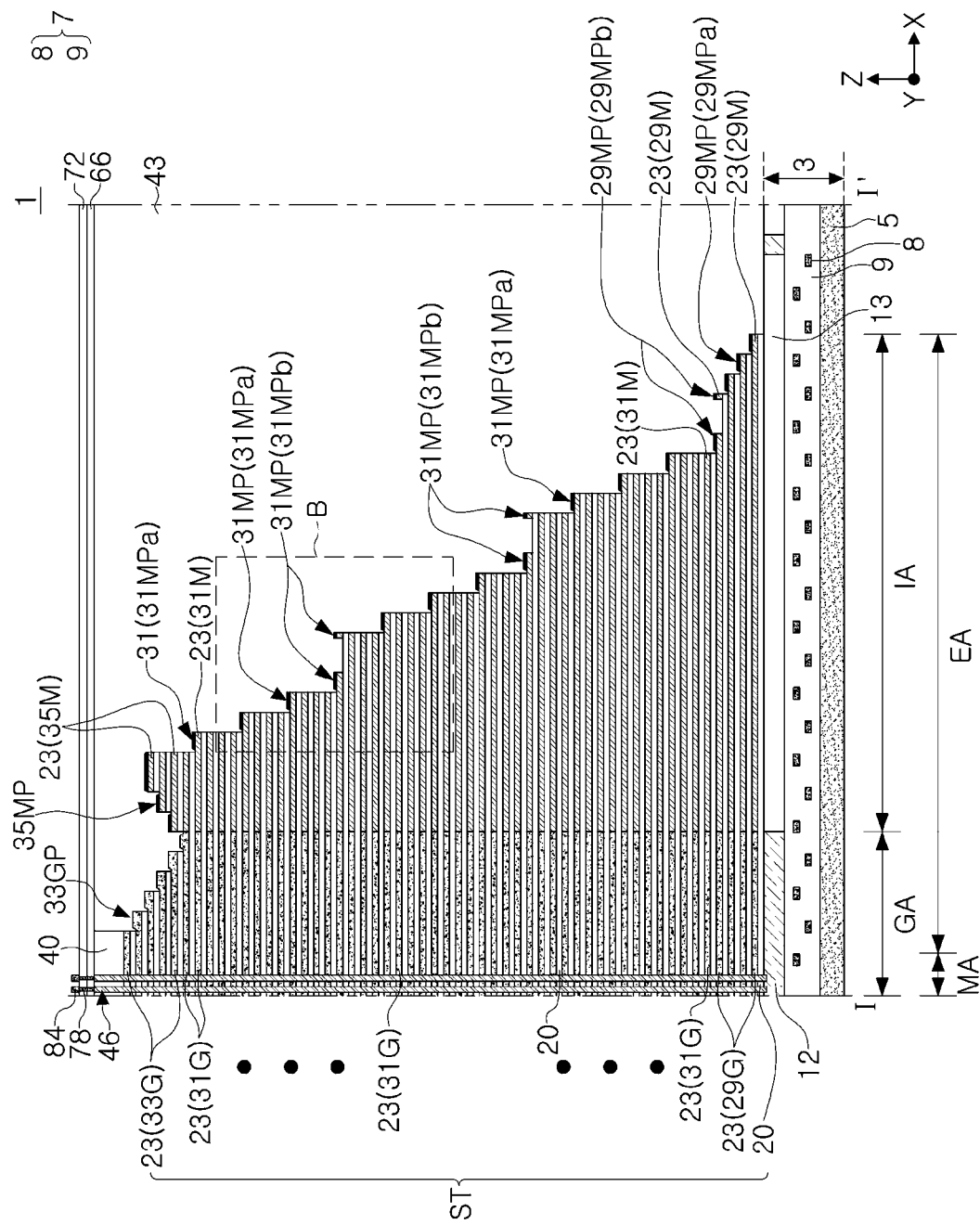
FIGS. 3 to 12 are cross-sectional diagrams illustrating an example of a semiconductor device according to an example embodiment of the present inventive concepts.
Figure 4:
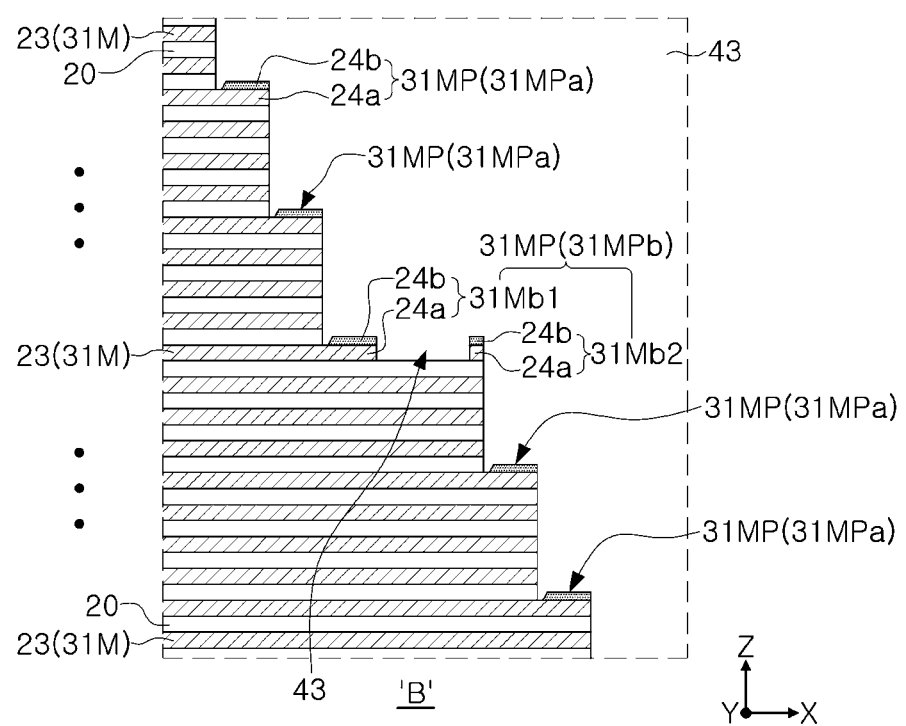
Figure 5:
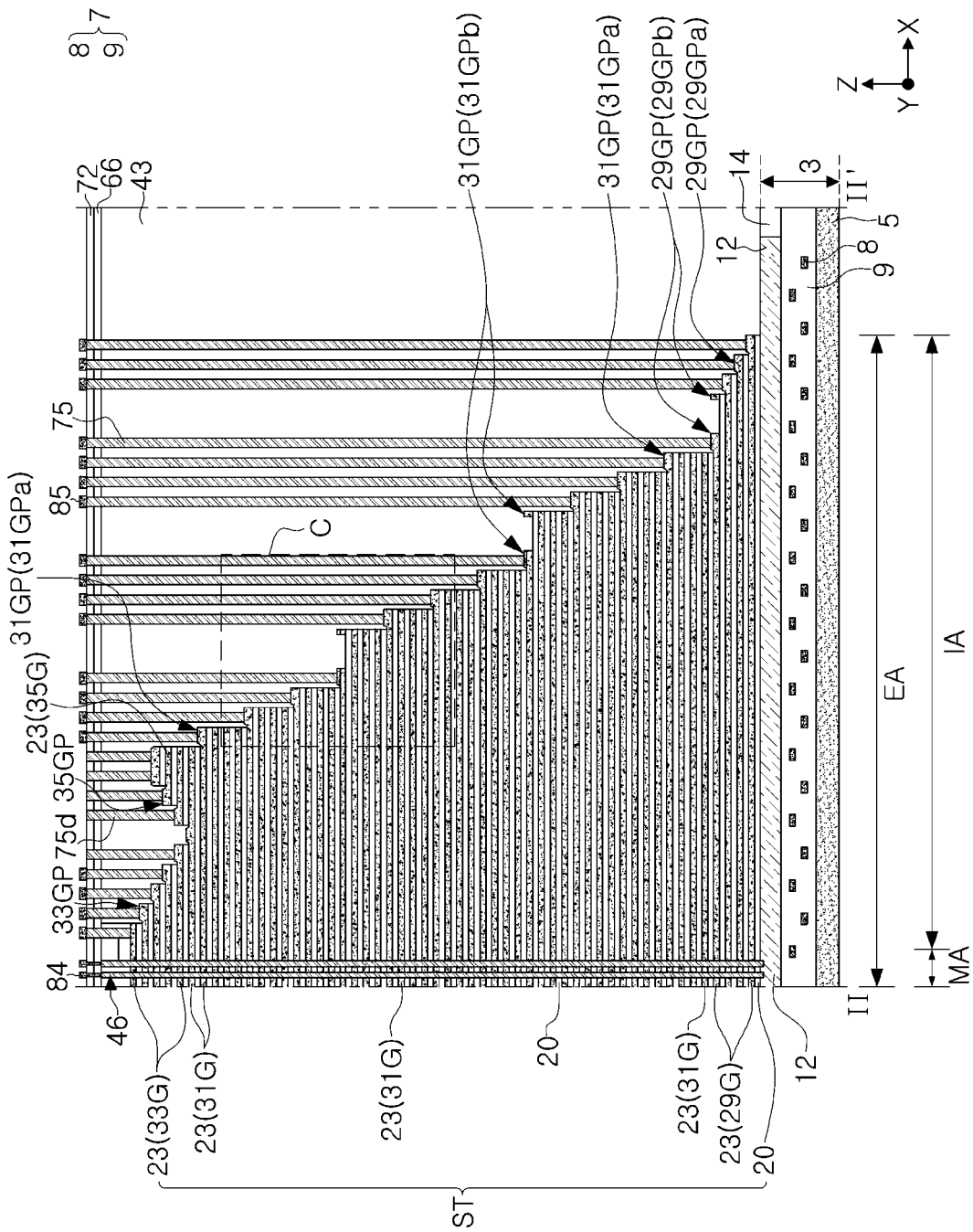
Figure 6:
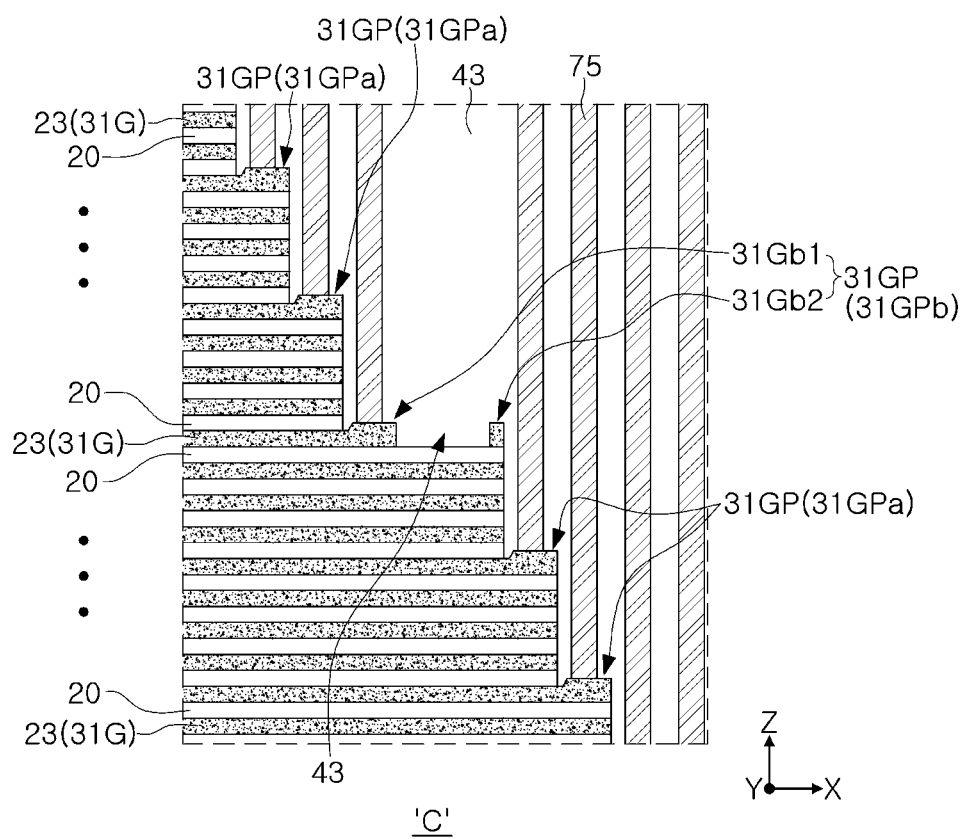
Figure 7:
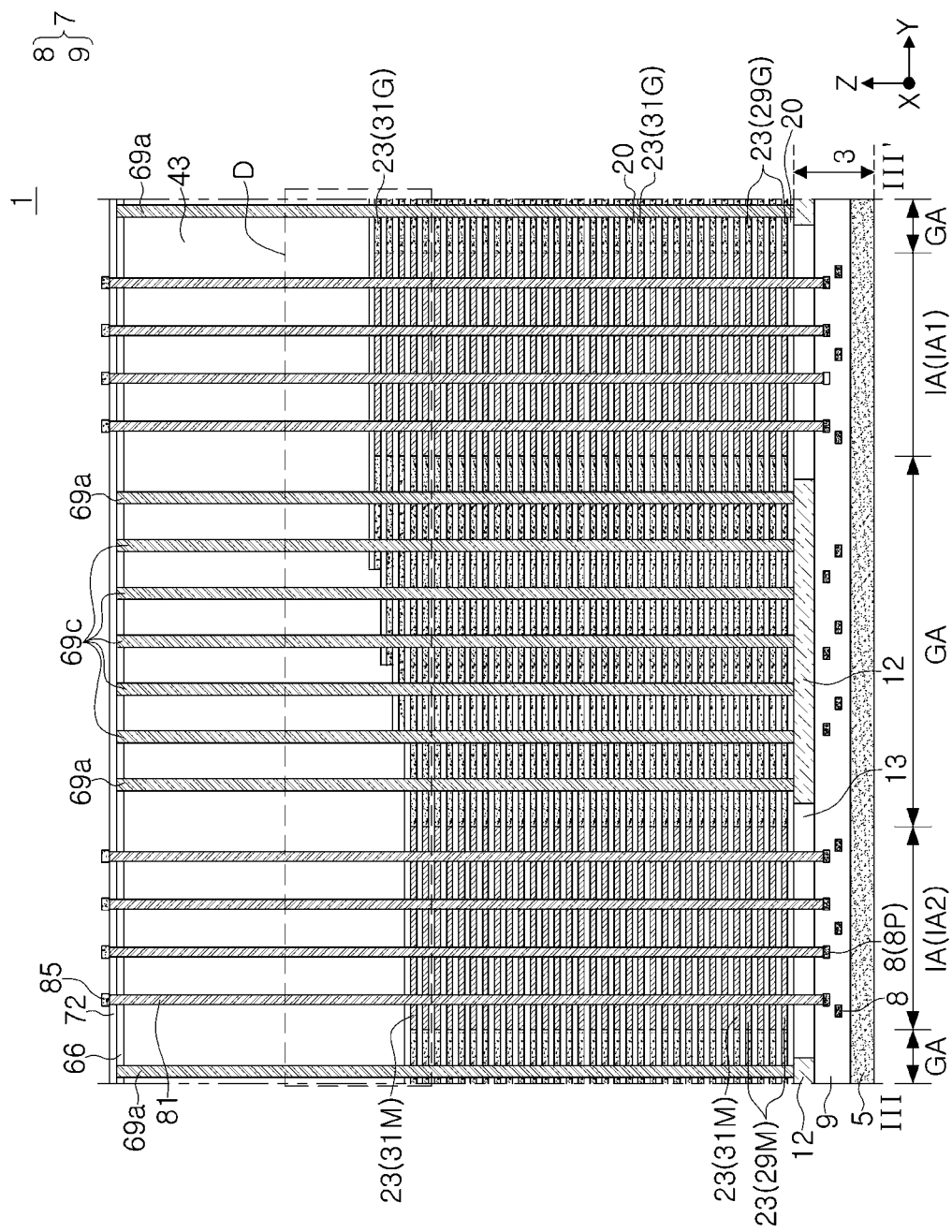
Figure 8:
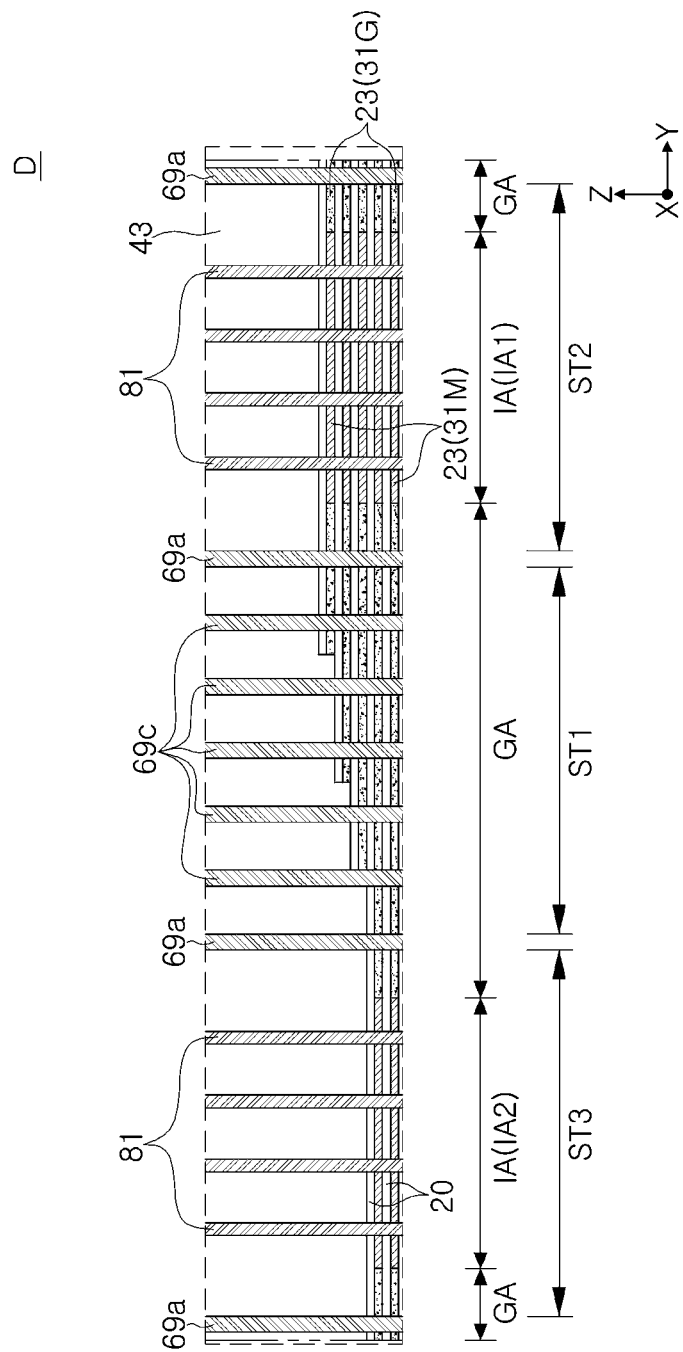
Figure 9:
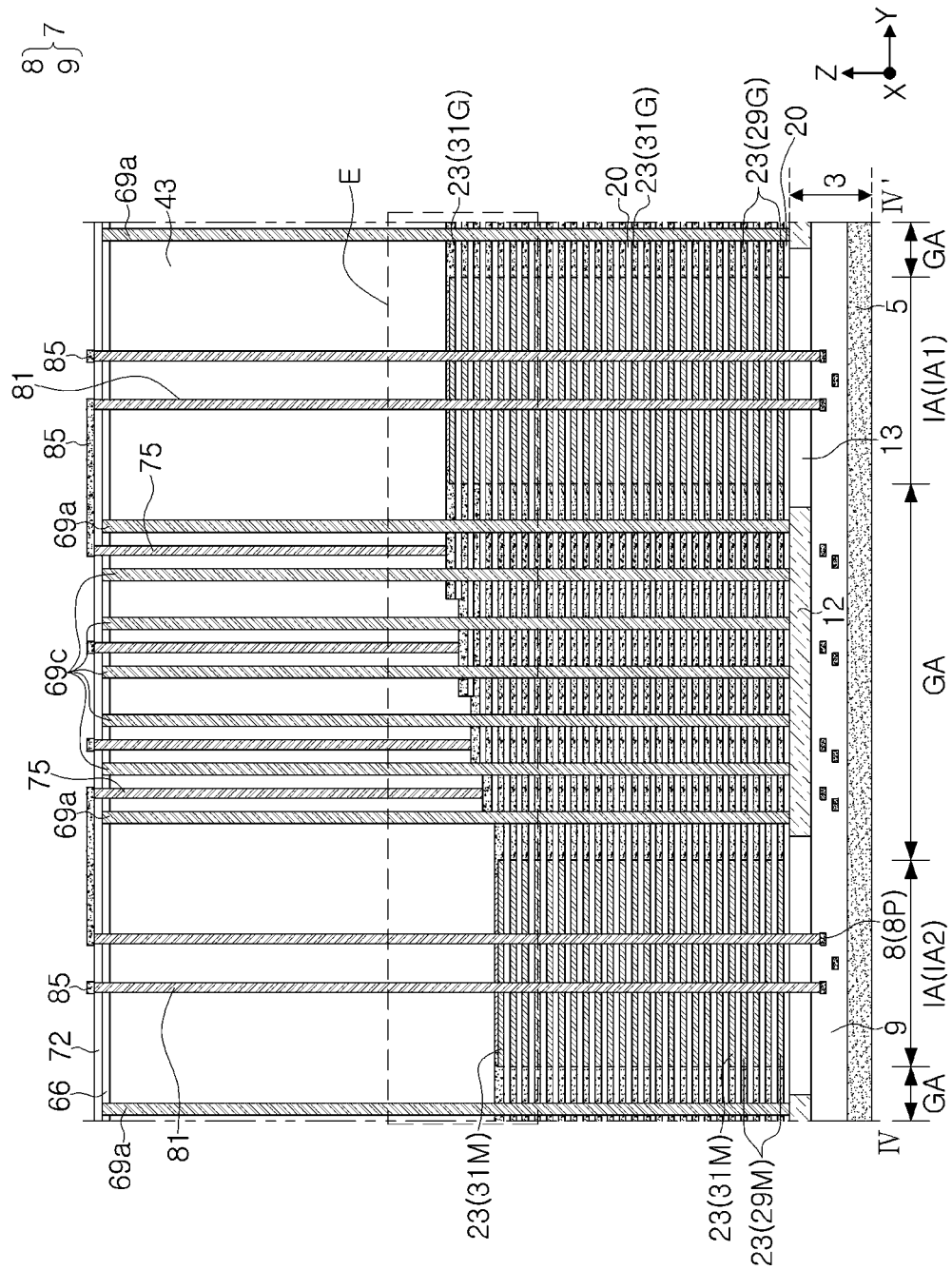
Figure 10:
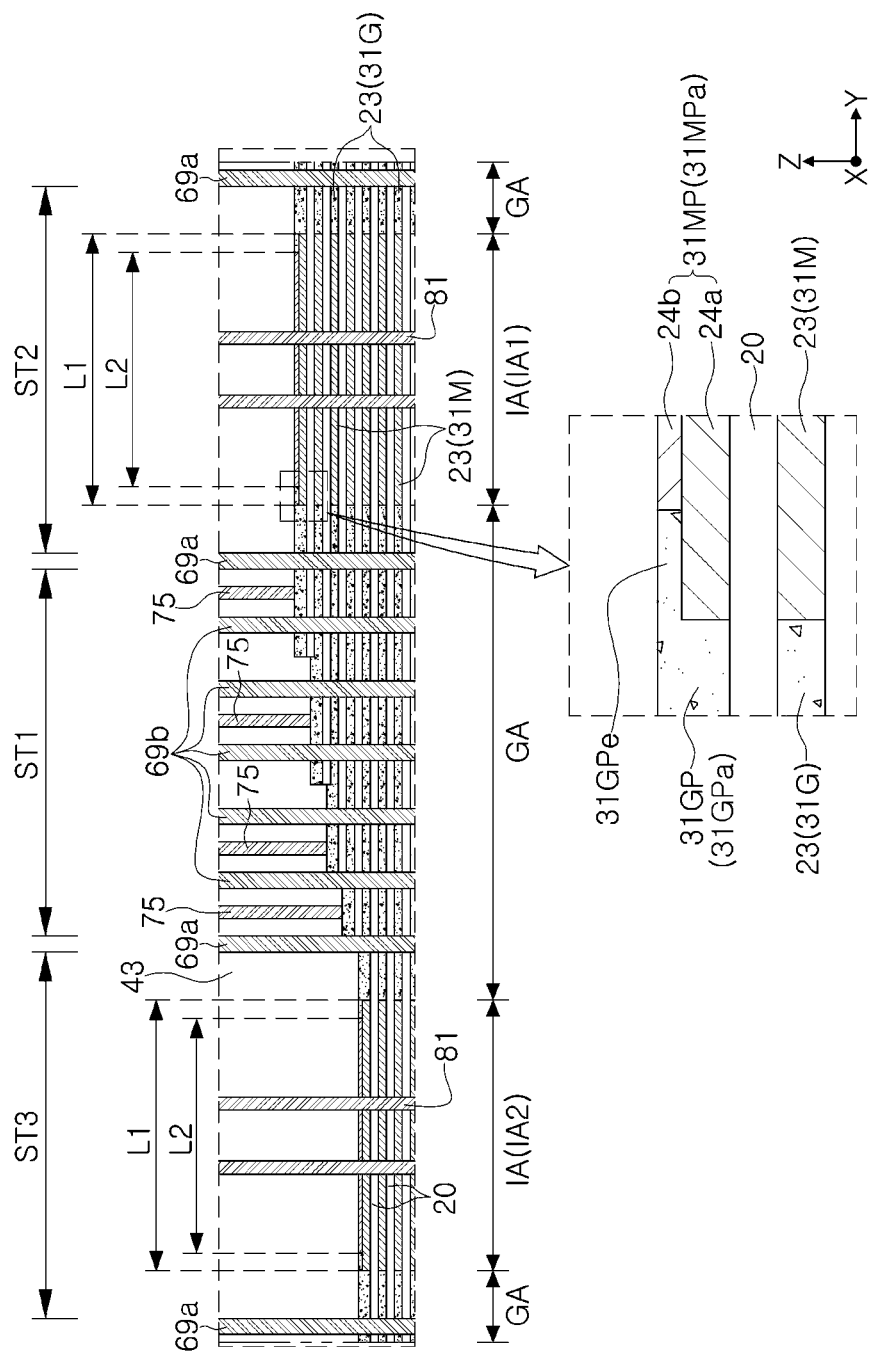
Figure 11:
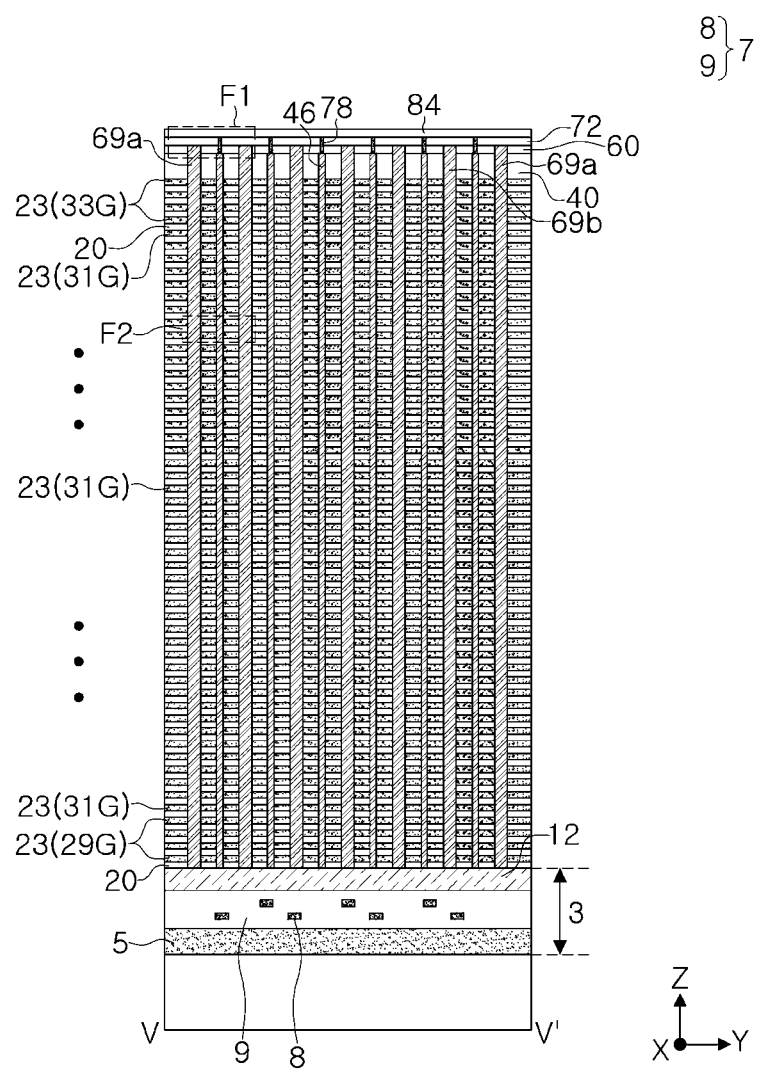
Figure 12:
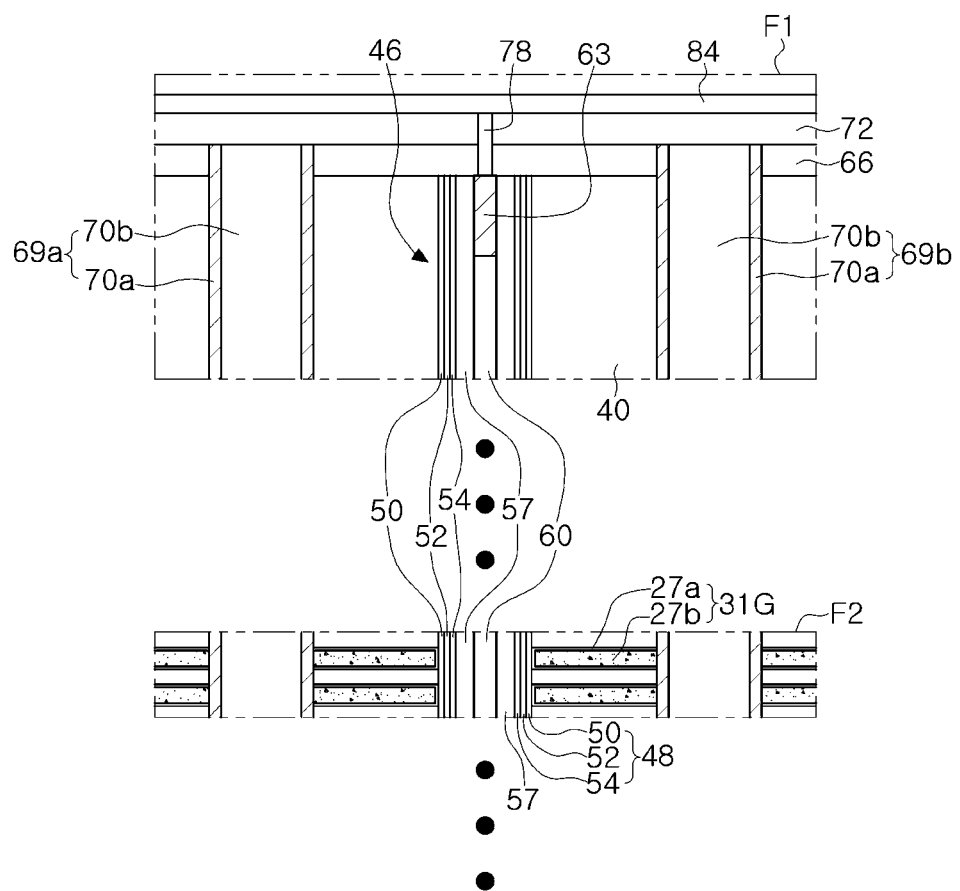

An example of a semiconductor device according to an example embodiment of the present inventive concepts will be described with reference to FIGS. 1 to 12. In the description below, each element will be described with reference to FIGS. 1 to 12, and an example of each element will be described with reference to portions of FIGS. 1 to 12. With regard to FIGS. 1 to 12, FIG. 1 is a plan diagram illustrating a semiconductor device according to an example embodiment of the present inventive concepts, FIG. 2 is an enlarged plan diagram illustrating portion "A" illustrated in FIG. 1, FIG. 3 is a cross-sectional diagram taken along line I-I' in FIG. 2, FIG. 4 is an enlarged plan diagram illustrating portion "B" illustrated in FIG. 3, FIG. 5 is a cross-sectional diagram taken along line II-II' in FIG. 2, FIG. 6 is an enlarged plan diagram illustrating portion "C" illustrated in FIG. 5, FIG. 7 is a cross-sectional diagram taken along line in FIG. 2, FIG. 8 is an enlarged plan diagram illustrating portion "D" illustrated in FIG. 7, FIG. 9 is a cross-sectional diagram taken along line IV-IV' in FIG. 2, FIG. 10 is an enlarged plan diagram illustrating portion "E" illustrated in FIG. 9, FIG. 11 is a cross-sectional diagram taken along line V-V' in FIG. 2, and FIG. 12 is an enlarged diagram illustrating portions "F1" and "F2" illustrated in FIG. 11.

Referring to FIGS. 1 to 12, a semiconductor device 1 in the example embodiment may include a lower structure 3, a memory cell array region MA on the lower structure 3, and a connection region EA. The memory cell array region MA and the connection region EA may be adjacent to each other.

The lower structure 3 may include a lower substrate 5, an upper substrate 12 on the lower substrate 5, and a peripheral circuit region 7 between the lower substrate 5 and the upper substrate 12.

The lower structure 3 may further include a gap-fill insulating layer 13 penetrating the upper substrate 12, and an intermediate insulating layer 14 on, and in some embodiments, surrounding, the upper substrate 12. The peripheral circuit region 7 may include peripheral wirings 8 and a lower insulating layer 9 on, and in some embodiments covering, the peripheral wirings 8.

The semiconductor device 1 in the example embodiment may include a stack structure ST on the lower structure 3.

The stack structure ST may be disposed in the memory cell array region MA, and may extend into the connection region EA.

The stack structure ST may include a gate region GA including a conductive material, and an insulating region IA which does not include a conductive material.

The gate region GA may be disposed in the memory cell array region MA, and may be partially disposed in the connection region EA. The insulating region IA may be disposed in the connection region EA, and may be adjacent to the gate region GA.

The stack structure ST may include first layers 20 and second layers 23 alternately stacked on the lower structure 3.

The first layers 20 may be disposed in the gate region GA and the insulating region IA. The first layers 20 may be configured as interlayer insulating layers.

The second layers 23 may include gate layers 29G, 31G, 33G, and 35G disposed in the gate region GA, and mold layers 29M, 31M, and 35M disposed in the insulating region IA.

In an example embodiment, the mold layers 29M, 31M, and 35M may be formed of an insulating material having etching selectivity different from an etching selectivity of the first layers 20. For example, the first layers 20 may be formed of silicon oxide, and the mold layers 29M, 31M, and 35M may be formed of silicon nitride.

In an example embodiment, each of the gate layers 29G, 31G, 33G, and 35G may include a conductive material. For example, each of the gate layers 29G, 31G, 33G, and 35G may be configured as gate electrodes.

The gate layers 29G, 31G, 33G, and 35G may include one or a plurality of lower gate layers 29G, a plurality of intermediate gate layers 31G on the one or the plurality of lower gate layers 29G, and a plurality of upper gate layers 33G on the plurality of intermediate gate layers 31G.

The mold layers 29M, 31M, and 35M may include one or a plurality of lower mold layers 29M, a plurality of intermediate mold layers 31M on the one or the plurality of lower mold layers 29M, and a plurality of upper mold layers 35M on the plurality of intermediate mold layers 31M.

The lower and intermediate gate layers 29G and 31G and the lower and intermediate mold layers 29M and 31M disposed on the same level in a boundary region between the gate region GA and the insulating region IA may be on opposite sides of each other and may be in contact with each other.

The gate layers 29G, 31G, 33G, and 35G may further include floating gate layers 35G, and the mold layers 29M, 31M, and 35M may further include floating mold layers 35M.

The floating gate layers 35G may be disposed on the plurality of intermediate mold layers 31M in the connection region EA, and may be spaced apart from the plurality of upper gate layers 33G. The floating mold layers 35M may be disposed on the plurality of intermediate mold layers 31M in the connection region EA, and may be spaced apart from the plurality of upper gate layers 33G.

The gate layers 29G, 31G, 33G, and 35G may include a plurality of gate pads arranged in staircase form, and the mold layers 29M, 31M, and 35M may include a plurality of mold pads arranged in staircase form. As used herein, a "staircase form" or "staircase structure" refers to a plurality of layers in which an outermost edge of a first layer extends laterally beyond an outermost edge of a second layer that is immediately above the first layer.

The one or the plurality of lower gate layers 29G may include one or a plurality of lower gate pads 29GP, the plurality of intermediate gate layers 31G may include intermediate gate pads 31GP, the plurality of upper gate layers 33G may include upper gate pads 33GP, and the floating gate layers 35G may include floating gate pads 35GP.

The one or the plurality of lower mold layers 29M may include one or a plurality of lower mold pads 29MP, the plurality of intermediate mold layers 31M may include intermediate mold pads 31MP, and the floating mold layers 35M may include floating mold pads 35MP.

The semiconductor device 1 in the example embodiment of the present inventive concepts may further include a memory cell vertical structure 46 in the memory cell array region MA. The memory cell vertical structure 46 may penetrate the gate region GA of the stack structure ST.

The semiconductor device 1 in the example embodiment may further include a plurality of separation structures 69a, 69b, and 69c.

The plurality of separation structures 69a, 69b, and 69c may include a plurality of first separation structures 69a crossing the memory cell array region MA and the connection region EA, a plurality of second separation structures 69b crossing the memory cell array region MA and extending into a partial region of the connection region EA, and a plurality of third separation structures 69c disposed in the connection region EA.

The plurality of second separation structures 69b may be disposed between the plurality of first separation structures 69a. The plurality of third separation structures 69c may be disposed between the plurality of first separation structures 69a.

The stack structure ST may be divided into a plurality of regions by the plurality of first separation structures 69a. As illustrated in FIG. 2, in the connection region EA, the stack structure ST may include a first stack region ST1, a second stack region ST2 on a first side of the first stack region ST1, and a third stack region ST3 on a second side of the first stack region ST1, opposite the first side. Accordingly, in the connection region EA, the first stack region ST1 may be disposed between the second stack region ST2 and the third stack region ST3. The first stack region ST1, the second stack region ST2, and the third stack region ST3 may be separated from one another by ones of the plurality of first separation structures 69a.

The plurality of third separation structures 69c may be disposed in the first stack region ST1, and may not be disposed in the second stack region ST2 and the third stack region ST3.

In the first stack region ST1, the plurality of third separation structures 69c and the plurality of second separation structures 69b may have end portions opposing each other.

In the stack structure ST, the gate region GA may be disposed across the memory cell array region MA and the first stack region ST1, and may be disposed in a portion of the second stack region ST2 and a portion of the third stack region ST3.

In the stack structure ST, the insulating region IA may include a first insulating region IA1 disposed in a portion of the second stack region ST2 and a second insulating region IA2 disposed in a portion of the third stack region ST3.

In the connection region EA, the upper gate layers 33G may include upper gate pads 33GP descending to a first height (e.g., in the Z direction in FIG. 3) in a first direction X. In other words, respective ones of the upper gate pads 33GP are lower in the Z direction as the respective upper gate pads 33GP extend in the first direction X. The first direction X may be directed to the connection region EA from the memory cell array region MA.

In the connection region EA, the intermediate gate layers 31G and the intermediate mold layers 31M may respectively include intermediate pads 31GP and 31MP descending to a second height (e.g., in the Z direction in FIGS. 3 and 5) higher than the first height in the first direction X. In other words, a distance between respective adjacent ones of the intermediate pads 31GP and 31MP is greater in the Z direction than a distance between respective adjacent ones of upper gate pads 33GP.

The intermediate pads 31GP and 31MP may include the intermediate gate pads 31GP of the intermediate gate layers 31G and the intermediate mold pads 31MP of the intermediate mold layers 31M. In the second stack region ST2 and the third stack region ST3, respective ones of the intermediate pads 31GP and 31MP may be disposed at a constant level in a second direction Y. In the first stack region ST1, respective ones of the intermediate pads 31GP and 31MP may be lowered to the first height in a direction from the second stack region ST2 to the third stack region ST3.

In the connection region EA, the lower gate layers 29G and the lower mold layers 29M may include lower pads 29GP and 29MP lowered to a first height in the first direction X from a staircase having a certain height in the second stack region ST2 and lowered to the first height in a direction towards the third stack region ST3 from the second stack region ST2 in the first stack region ST1. The lower pads 29GP and 29MP may include lower gate pads 29GP of the lower gate layers 29G and lower mold pads 29MP of the lower mold layers 29M.

The first direction X may be directed to the connection region EA from the memory cell array region MA, and the second direction Y may be perpendicular to the first direction X.

In the connection region EA, the floating gate layers 35G and the floating mold layers 35M may include floating pads 35GP and 35MP lowered to a second height in a direction towards the upper gate pads 33GP from a staircase having a certain height in the second stack region ST2 and lowered to the second height in a direction towards the third stack region ST3 from the second stack region ST2 in the first stack region ST1.

The floating pads 35GP and 35MP may include floating gate pads 35GP of the floating gate layers 35G and floating mold pads 35MP of the floating mold layers 35M.

In example embodiments, the first height may refer to a distance between upper surfaces of the second layers 23 adjacent to each other in a vertical direction Z.

In example embodiments, the second height may be greater than the first height. For example, the second height may refer to a distance between an upper surface of a lowermost second layer of four second layers 23 arranged in the vertical direction Z and an upper surface of an uppermost second layer.

A first capping insulating layer 40 and a second capping insulating layer 43 may be disposed on the stack structure ST. The first capping insulating layer 40 may be on, and in some embodiments cover, an uppermost second layer of the second layers 23, and the second capping insulating layer 43 may have an upper surface coplanar with an upper surface of the first capping insulating layer 40 and may be on, and in some embodiments cover, a remaining portion of the stack structure ST.

A first upper insulating layer 66 and a second upper insulating layer 72 stacked in order may be disposed on the first capping insulating layer 40 and the second capping insulating layer 43. The first to third separation structures 69a, 69b, and 69c may penetrate the stack structure ST, may extend upwardly, and may penetrate the first and second capping insulating layers 40 and 43 and the first upper insulating layer 66.

Bit line contact plugs 78 penetrating the first upper insulating layer 66 and the second upper insulating layer 72 and electrically connected to the memory cell vertical structure 46 may be disposed.

In the connection region EA, gate contact structures 75 penetrating the first upper insulating layer 66 and the second upper insulating layer 72, extending downwardly, and electrically connected to the lower, intermediate, and upper gate pads 29GP, 31GP, and 33GP may be disposed.

Peripheral contact structures 81 in contact with peripheral pad portions 8P of the peripheral wirings 8, extending upwardly, and penetrating the gap-fill insulating layer 13 and the insulating region IA of the stack structure ST may be disposed.

Gate connection wirings 85 may be disposed on the gate contact structures 75 and the peripheral contact structures 81.

In an example embodiment, in the connection region EA, dummy contact plugs 75d penetrating the first upper insulating layer 66 and the second upper insulating layer 72, extending downwardly, and electrically connected to the floating gate pads 35GP may be disposed. The dummy contact plugs 75d may be electrically insulated from the gate connection wirings 85. Bit lines 84 may be disposed on the bit line contact plugs 78.

In the description below, the intermediate mold pads 31MP of the intermediate mold layers 31M will be described in greater detail with reference to FIGS. 3 and 4.

Referring to FIGS. 3 and 4, the intermediate mold pads 31MP of the intermediate mold layers 31M may include first intermediate mold pads 31MPa and a second intermediate mold pad 31MPb disposed between the first intermediate mold pads 31MPa. The second intermediate mold pad 31MPb may be disposed between some of the plurality of first intermediate mold pads 31MPa and some of the plurality of first intermediate mold pads 31MPa.

The first intermediate mold pads 31MPa may respectively have the same or similar structure, and the second intermediate mold pad 31MPb may have a structure different from the structure of each of the first intermediate mold pads 31MPa.

In an example embodiment, each of the first intermediate mold pads 31MPa may have a first length in the first direction X, and the second intermediate mold pad 31MPb may have a second length in the first direction X, greater than the first length.

In an example embodiment, each of the first intermediate mold pads 31MPa and the second intermediate mold pad 31MPb may include a mold pad portion 24a and an insulating protrusion portion 24b on the mold pad portion 24a.

The insulating protrusion portion 24b may be formed of a material having etching selectivity different from etching selectivity of the mold pad portion 24a. For example, the mold pad portion 24a may be formed of a first insulating material based on (e.g., including) silicon nitride, and the insulating protrusion portion 24b may be formed of a second insulating material based on (e.g., including) silicon nitride having an etching speed higher than an etching speed of the first insulating material, though the present inventive concepts are not limited thereto. For example, the mold pad portion 24a may be formed of a first silicon nitride, and the insulating protrusion portion 24b may be formed of a second silicon nitride configured to be more porous than the first silicon nitride. The second silicon nitride may have an etching speed higher than an etching speed of the first silicon nitride with respect to an etchant including phosphate.

In an example embodiment, the second intermediate mold pad 31MPb may include a first portion 31Mb1 and a second portion 31Mb2 spaced apart from each other in the first direction X. The first portion 31Mb1 and the second portion 31Mb2 may be spaced apart from the memory cell array region MA in order. For example, the first portion 31Mb1 may be between the second portion 31Mb2 and the memory cell array region MA in the first direction X.

Each of the first portion 31Mb1 and the second portion 31Mb2 may include the mold pad portion 24a and the insulating protrusion portion 24b described above. A length of the first portion 31Mb1 in the first direction X may be greater than a length of the second portion 31Mb2 in the first direction X.

The length of the first portion 31Mb1 in the first direction X may be substantially the same as a length of each of the first intermediate mold pads 31MPa in the first direction X. A length of the second portion 31Mb2 in the first direction X may be less than a length of each of the first intermediate mold pads 31MPa in the first direction X.

In an example embodiment, one or a plurality of the second intermediate mold pads 31MPb may be disposed. When the plurality of second intermediate mold pads 31MPb are disposed, each of the plurality of second intermediate mold pads 31MPb may be disposed between one of the plurality of first intermediate mold pads 31MPa and another of the plurality of first intermediate mold pads 31MPa. When the plurality of second intermediate mold pads 31MPb are disposed, each of the plurality of second intermediate mold pads 31MPb may have the first portion 31Mb1 and the second portion 31Mb2.

The plurality of second intermediate mold pads 31MPb may be disposed in each of the first insulating region IA1 and the second insulating region IA2. In FIG. 2, portion "CTa" overlapping the first insulating region IA1 and the second insulating region IA2 may refer to a central region of the second intermediate mold pad 31MPb disposed between the first portion 31Mb1 and the second portion 31Mb2 of each of the plurality of second intermediate mold pads 31MPb. At least the central region of the second intermediate mold pad 31MPb may not include the insulating protrusion portion 24b.

The central region of the second intermediate mold pad 31MPb may include, and in some embodiments be filled with, the second capping insulating layer 43. The second capping insulating layer 43 may include an insulating material different from an insulating material of the intermediate mold layers 31M. For example, when the second capping insulating layer 43 is formed of a single material such as silicon oxide, or the like, a region between the first portion 31Mb1 and the second portion 31Mb2 of the second intermediate mold pad 31MPb may be filled with the silicon oxide of the second capping insulating layer 43. Differently from the above-described example embodiment, when the second capping insulating layer 43 is formed of at least two materials of a barrier insulating layer and a capping insulating layer, a region between the first portion 31Mb1 and the second portion 31Mb2 of the second intermediate mold pad 31MPb may be filled with the barrier insulating layer of the second capping insulating layer 43. The barrier insulating layer of the second capping insulating layer 43 may be formed of a material different from silicon nitride, such as aluminum oxide, or the like, for example, and the capping insulating layer of the second capping insulating layer 43 may be formed of silicon oxide.

Referring back to FIG. 3, the lower mold pads 29MP of the lower mold layers 29M may include first lower mold pads 29MPa and a second lower mold pad 29MPb. The second lower mold pad 29MPb may be disposed between the first lower mold pads 29MPa and the first intermediate mold pads 31MPa.

A length of the second lower mold pad 29MPb in the first direction X may be greater than a length of each of the first lower mold pads 29MPa in the first direction X. The second lower mold pad 29MPb may have a structure the same as or similar to a structure of the second intermediate mold pad 31MPb and may be formed of a material the same as or similar to a material of the second intermediate mold pad 31MPb.

In FIG. 2, portion "CTb" overlapping the first insulating region IA1 and the second insulating region IA2 may refer to a central region of each of the second lower mold pads 29MPb.

In the description below, the intermediate gate pads 31GP of the intermediate gate layers 31G, arranged in the first direction X, will be described in greater detail with reference to FIGS. 5 and 6.

Referring to FIGS. 5 and 6, the intermediate gate layers 31G may include the intermediate gate pads 31GP each having an increased thickness.

The intermediate gate pads 31GP may include first intermediate gate pads 31GPa, and a second intermediate gate pad 31GPb disposed between adjacent ones of the first intermediate gate pads 31GPa. For example, the second intermediate gate pad 31GPb may be disposed between one of the plurality of first intermediate gate pads 31GPa and another of the plurality of first intermediate gate pads 31GPa.

The second intermediate gate pad 31GPb may have a structure different from a structure of each of the first intermediate gate pads 31GPa.

In an example embodiment, each of the first intermediate gate pads 31GPa may have a first length in the first direction X, and the second intermediate gate pad 31GPb may have a second length in the first direction X, greater than the first length.

In an example embodiment, the second intermediate gate pad 31GPb may include a first portion 31GPb1 and a second portion 31GPb2 spaced apart from each other in the first direction X. A length of the first portion 31GPb1 in the first direction X may be greater than a length of the second portion 31GPb2 in the first direction X.

A length of the first portion 31GPb1 in the first direction X may be substantially the same as a length of each of the first intermediate gate pads 31GPa in the first direction X. A length of the second portion 31GPb2 in the first direction X may be less than a length of each of the first intermediate gate pads 31GPa in the first direction X.

In an example embodiment, one or a plurality of the second intermediate gate pads 31GPb may be disposed. When the plurality of second intermediate gate pads 31GPb are disposed, each of the plurality of second intermediate gate pads 31GPb may be disposed between one of the plurality of first intermediate gate pads 31GPa and another one of the plurality of first intermediate gate pads 31GPa.

Similarly to the second intermediate mold pad 31MPb, a central region of the second intermediate mold pad 31MPb may include and, in some embodiments be filled with, the second capping insulating layer 43. For example, a central region between the first portion 31GPb1 and the second portion 31GPb2 of the second intermediate gate pad 31GPb may include, and in some embodiments be filled with, the second capping insulating layer 43. In FIG. 2, portion "CTa" overlapping the gate region GA may refer to a central region of each of the second intermediate gate pads 31GPb.

The lower gate pads 29GP of the lower gate layers 29G may include first lower gate pads 29GPa and a second lower gate pad 29GPb. The second lower gate pad 29GPb may be disposed between the first lower gate pads 29GPa and the first intermediate gate pads 31GPa.

A length of the second lower gate pad 29GPb in the first direction X may be greater than a length of each of the first lower gate pads 29GPa in the first direction X. The second lower gate pad 29GPb may have a structure substantially the same as the structure of the second intermediate gate pad 31GPb and may be formed of a material the same as or similar to a material of the second intermediate gate pad 31GPb. In FIG. 2, portion "CTb" overlapping the gate region GA may refer to a central region of each of the second lower gate pads 29GPb.

In the description below, the insulating region IA and the gate region GA will be described in greater detail with reference to FIGS. 7, 8, 9, and 10. FIGS. 7 and 8 may illustrate a cross-sectional surface of a region between the first portion 31Mb1 and the second portion 31Mb2 of the second intermediate mold pad 31MPb spaced apart from each other in the first direction X, illustrated in FIG. 4. FIGS. 9 and 10 may illustrate a cross-sectional structure of a central region of one of the first intermediate mold pads 31MPa in the second direction Y.

Referring to FIGS. 7 and 8, in the cross-sectional structure of a region between the first portion 31Mb1 (in FIG. 4) and the second portion 31Mb2 (in FIG. 4) in the second direction, an uppermost second layer of the second layers 23, the second intermediate mold layer 31M and the second intermediate gate layer 31G, may not include a portion having an increased thickness.

In the cross-sectional structure of a region between the first portion 31Mb1 (in FIG. 4) and the second portion 31Mb2 (in FIG. 4) in the second direction, a width of the insulating region IA in the second direction Y may be determined by a width of the second intermediate mold layer 31M in the second direction Y.

Referring to FIGS. 9 and 10, in the second stack region ST2 (in FIG. 2), the intermediate pads 31GP and 31MP may be disposed at a constant level. In the first stack region ST1 (in FIG. 2), the intermediate gate pads 31GP of the intermediate pads 31GP and 31MP may be lowered to the first height in a direction towards the third stack region ST3 (in FIG. 2) from the second stack region ST2. In the third stack region ST3 (in FIG. 2), the intermediate pads 31GP and 31MP may be disposed at a constant level.

As described in the example embodiment with reference to FIGS. 3 and 4, each of the first intermediate mold pads 31MPa may include the mold pad portion 24a and the insulating protrusion portion 24b on the mold pad portion 24a. A length of the insulating protrusion portion 24b in the second direction Y may be less than a length of the mold pad portion 24a in the second direction Y.

Each of first intermediate gate pads 31GPa of the intermediate gate pads 31GP adjacent to the first intermediate mold pads 31MPa may include a gate extension portion 31GPe extending from an upper region of a portion having an increased thickness to an upper surface of the mold pad portion 24a and adjacent to a side surface of the insulating protrusion portion 24b. The gate extension portion 31GPe may be in contact with an upper surface of the mold pad portion 24a and may be in contact with a side surface of the insulating protrusion portion 24b. Accordingly, each of the first intermediate gate pads 31GPa of the intermediate gate pads 31GP adjacent to the first intermediate mold pads 31MPa may include the gate extension portion 31GPe overlapping an upper surface of the mold pad portion 24a of the adjacent first intermediate mold pad 31MPa. A width of the insulating region IA in the second direction Y may be determined by a length of the insulating protrusion portion 24b in the second direction Y. A length of the insulating protrusion portion 24b in the second direction Y may be less than a length of each of the intermediate mold layers 31M in the second direction Y. A length of the mold pad portion 24a in the second direction Y may be the same as a length of each of the intermediate mold layers 31M in the second direction Y.

The insulating region IA may have a first length L1 in the second direction Y in the cross-sectional structure of a region between the first portion 31MPb1 (in FIG. 4) and the second portion 31MPb2 (in FIG. 4) in the second direction Y as in the example embodiment illustrated in FIGS. 7 and 8. The insulating region IA may also have a second length L2 in the second direction Y in a cross-sectional structure of the central region of one of the first intermediate mold pads 31MPa in the second direction Y as in the example embodiment illustrated in FIGS. 9 and 10. The first length L1 may be greater than the second length L2.

In the description below, the gate layers 29G, 31G, 33G, and 35G, the memory cell vertical structure 46, and the separation structures 69a, 69b, and 69c will be described in greater detail with reference to FIGS. 11 and 12.

Referring to FIGS. 11 and 12, each of the gate layers 29G, 31G, 33G, and 35G may include a first gate layer 27a and a second gate layer 27b. The first gate layer 27a may cover a lower surface and an upper surface of the second gate layer 27b and may extend to a region between the second gate layer 27b and the memory cell vertical structure 46.

In an example embodiment, the first gate layer 27a may include a first conductive material (e.g., tungsten (W), or the like), and the second gate layer 27b may include a second conductive material (e.g., titanium nitride (TiN), tungsten nitride (WN), or the like) different from the first conductive material.

In another example embodiment, the first gate layer 27a may include a dielectric material, and the second gate layer 27b may include a conductive material (e.g., TiN, W, or the like). A dielectric material of the first gate layer 27a may include a high-k dielectric such as aluminum oxide (AlO).

The memory cell vertical structure 46 may include a dielectric structure 48, a channel layer 57, a core layer 60, and a pad layer 63. The channel layer 57 may be disposed on a side surface of the core layer 60, the pad layer 63 may be disposed on the core layer 60, and the dielectric structure 48 may be disposed on an external side surface of the channel layer 57.

The dielectric structure 48 may include a first dielectric layer 50, a second dielectric layer 54, and a data storage layer 52 disposed between the first dielectric layer 50 and the second dielectric layer 54. The second dielectric layer 54 may be disposed between the channel layer 57 and the data storage layer 52.

The bit line contact plugs 78 may be in contact with the pad layer 63.

In an example embodiment, the intermediate gate layers 31G may include word lines. Regions of the data storage layer 52 opposing the intermediate gate layers 31G which may be configured as word lines may be configured as data storage regions which may store data in a flash memory device.

In an example embodiment, at least the one lower gate layer 29G or at least one of the plurality of lower gate layers 29G may be configured as a lower selection gate electrode, and at least one of the plurality of upper gate layers 33G may be configured as an upper selection gate electrode.

In another example embodiment, when a plurality of the lower gate layers 29G are provided, one of the plurality of lower gate layers 29G may be configured as a lower selection gate electrode, and the other may be configured as a lower erasing gate electrode used in an erasing operation of a flash memory device. One of the plurality of upper gate layers 33G may be configured as an upper selection gate electrode, and the other may be configured as an upper erasing gate electrode used in an erasing operation of a flash memory device.

In an example embodiment, each of the first to third separation structures 69a, 69b, and 69c may include a separation spacer 70a and a separation core pattern 70b. The separation core pattern 70b may be formed of an insulating material, and the separation core pattern 70b may be formed of a conductive material.

In another example embodiment, each of the first to third separation structures 69a, 69b, and 69c may be formed of an insulating material, silicon oxide, for example.

Figure 13A:
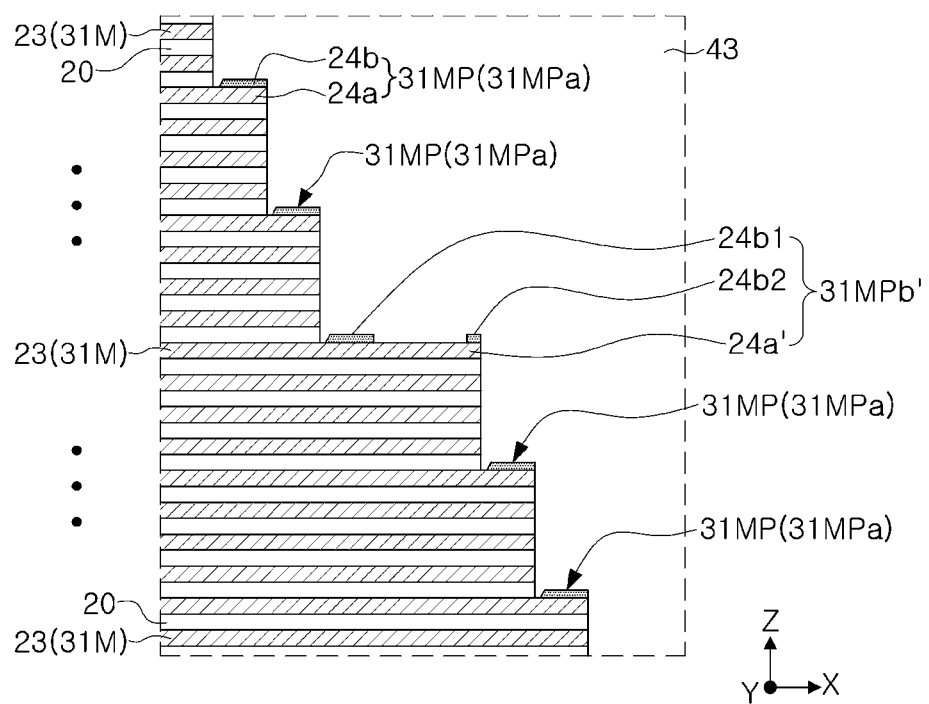
FIGS. 13A and 13B are enlarged cross-sectional diagrams illustrating a modified example of a semiconductor device according to an example embodiment of the present inventive concepts.

In the description below, a modified example of the second intermediate mold pad 31MPb (in FIG. 4) illustrated in FIG. 4 will be described with reference to FIG. 13A. FIG. 13A is an enlarged diagram illustrating a modified example of the second intermediate mold pad 31MPb (in FIG. 4) illustrated in FIG. 4.

In the modified example, referring to FIG. 13A, a second intermediate mold pad 31MPb' may include a mold pad portion 24a', and a first insulating protrusion portion 24b1 and a second insulating protrusion portion 24b2 disposed on the mold pad portion 24a' and spaced apart from each other. The first insulating protrusion portion 24b1 and the second insulating protrusion portion 24b2 may be spaced apart from a memory cell array region MA in order. A length of the first insulating protrusion portion 24b1 in the first direction X may be greater than a length of the second insulating protrusion portion 24b2 in the first direction X.

Figure 13B:
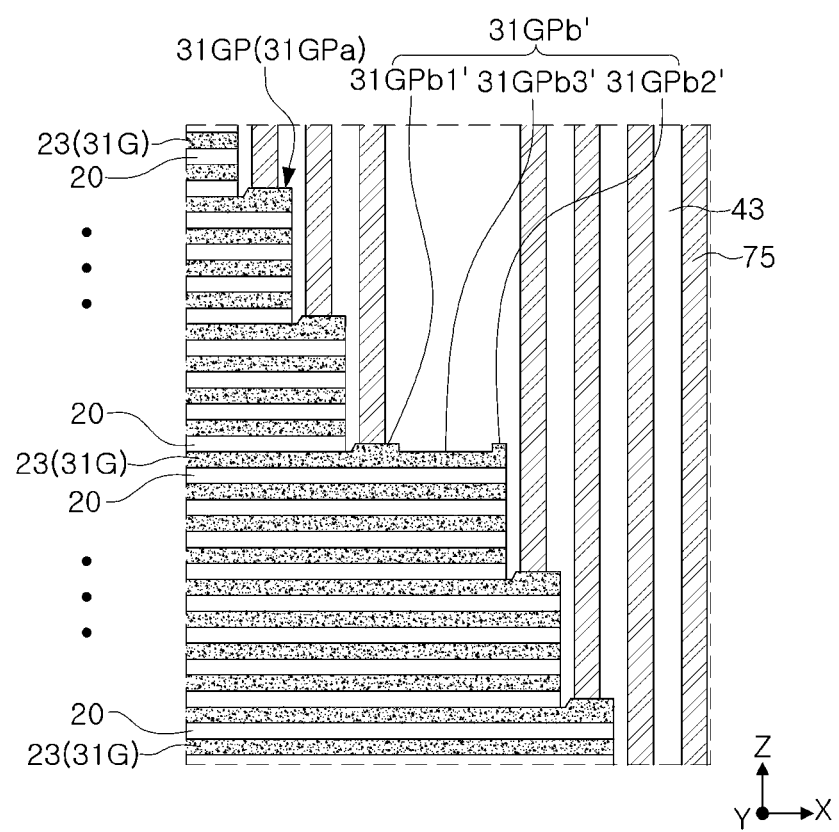

In the description below, a modified example of the second intermediate gate pad 31GPb (in FIG. 6) illustrated in FIG. 6 will be described with reference to FIG. 13B. FIG. 13B is an enlarged diagram illustrating a modified example of the second intermediate gate pad 31GPb (in FIG. 6) illustrated in FIG. 6.

In the modified example, referring to FIG. 13B, a second intermediate gate pad 31GPb' may include a first portion 31GPb1' and a second portion 31GPb2' arranged in order in the first direction X and each having an increased thickness, and a third portion 31GPb3' connecting the first portion 31GPb1' to the second portion 31GPb2'. A thickness (e.g., in a vertical Z direction) of the third portion 31GPb3' may be less than a thickness of each of the first portion 31GPb1' and the second portion 31GPb2'. The third portion 31GPb3' may be a central region of the second intermediate gate pad 31GPb'. The central region 31GPb3' of the second intermediate gate pad 31GPb' may include a conductive material layer. The first portion 31GPb1', the second portion 31GPb2', and the central region 31GPb3' may include the conductive material layer.

Figure 14:
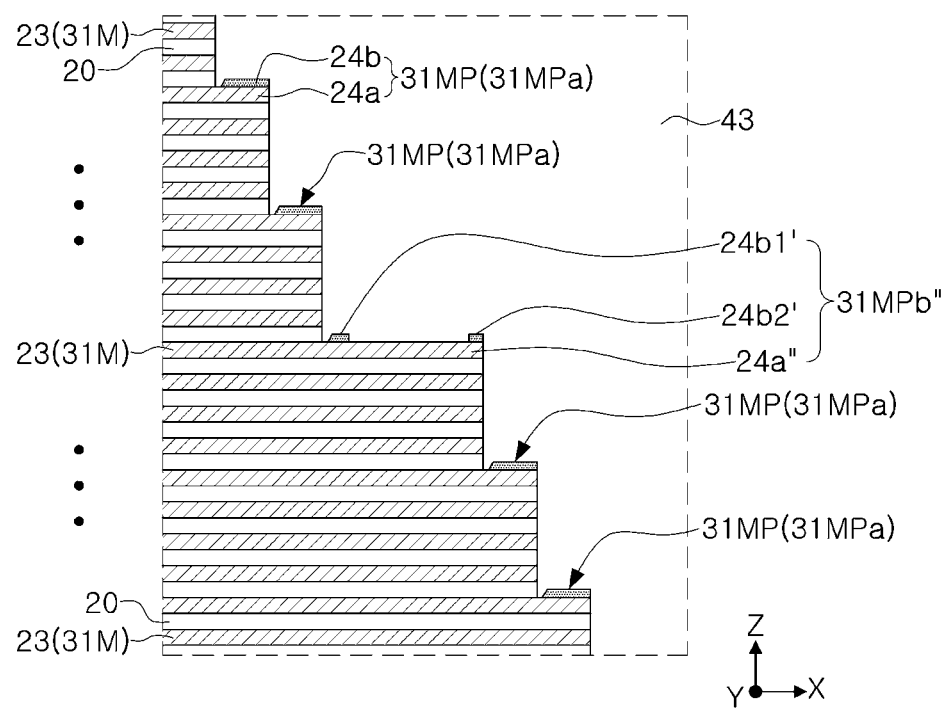
FIGS. 14 and 15 are enlarged cross-sectional diagrams illustrating another modified example of a semiconductor device according to an example embodiment of the present inventive concepts.

In the description below, a modified example of the second intermediate mold pad 31MPb (in FIG. 4) illustrated in FIG. 4 will be described with reference to FIG. 14. FIG. 14 is an enlarged diagram illustrating a modified example of the second intermediate mold pad 31MPb (in FIG. 4) illustrated in FIG. 4.

In the example embodiment, referring to FIG. 14, a second intermediate mold pad 31Mb" may include a mold pad portion 24a" and a first insulating protrusion portion 24b1' and a second insulating protrusion portion 24b2' disposed on the mold pad portion 24a" and spaced apart from each other. A length of each of the first insulating protrusion portion 24b1' and the second insulating protrusion portion 24b2' in the first direction X may be less than a length of each of first intermediate mold pads 31MPa in the first direction X.

Figure 15:
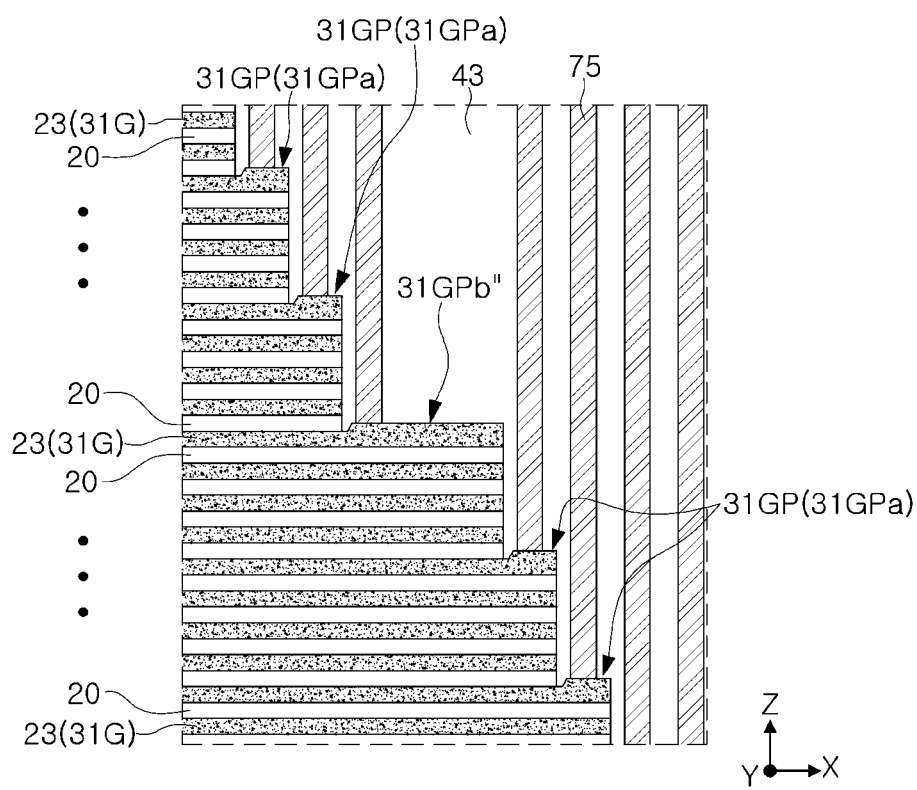

In the description below, a modified example of the second intermediate gate pad 31GPb (in FIG. 6) illustrated in FIG. 6 will be described. FIG. 15 is an enlarged diagram illustrating a modified example of the second intermediate gate pad 31GPb (in FIG. 6) illustrated in FIG. 6.

In the modified example, referring to FIG. 15, a second intermediate gate pad 31GPb" may have a thickness substantially the same as a thickness of each of first intermediate gate pads 31GPa, and may have a length in the first direction X greater than a length of each of the first intermediate gate pads 31GPa in the first direction X.

Figure 16:
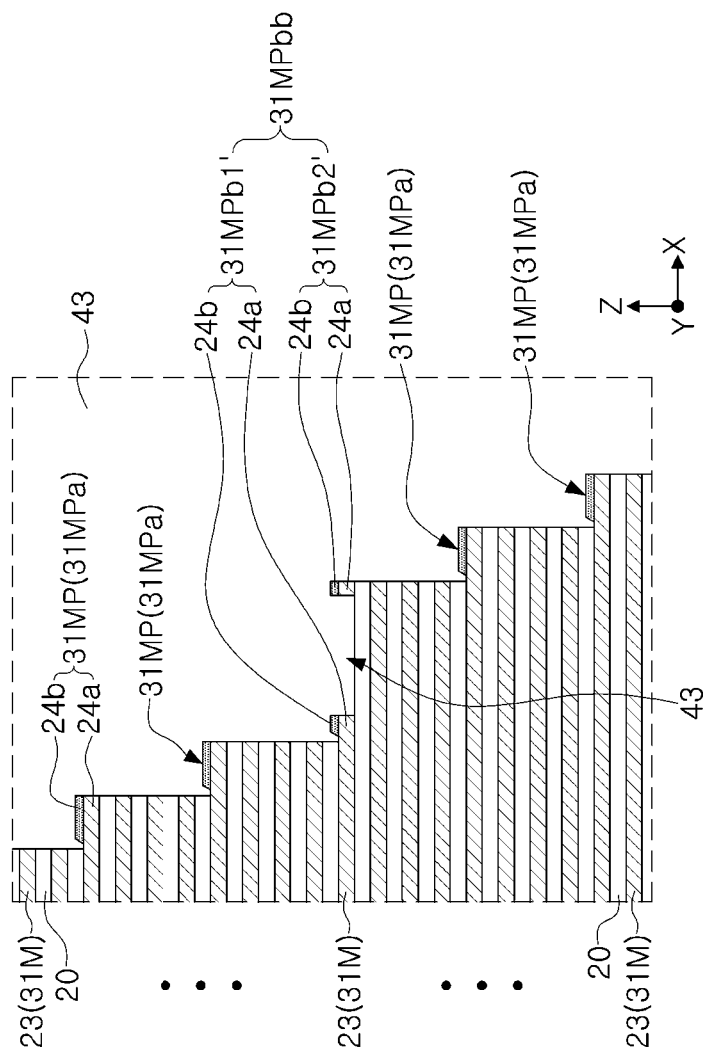
FIG. 16 is an enlarged cross-sectional diagram illustrating another modified example of a semiconductor device according to an example embodiment of the present inventive concepts.

In the description below, a modified example of the second intermediate mold pad 31MPb (in FIG. 4) will be described with reference to FIG. 16. FIG. 16 is an enlarged diagram illustrating another modified example of the second intermediate mold pad 31MPb illustrated in FIG. 4.

In the modified example, referring to FIG. 16, a second intermediate mold pad 31MPbb may include a first portion 31MPb1' and a second portion 31MPb2' spaced apart from each other in the first direction X. Each of the first portion 31MPb1' and the second portion 31MPb2' may include the mold pad portion 24a (FIG. 4) and the insulating protrusion portion 24b (FIG. 4) described in the aforementioned example embodiment.

A length of each of the first portion 31MPb1' and the second portion 31MPb2' in the first direction X may be less than a length of each of the first intermediate mold pads 31MPa in the first direction X.

Figure 17:
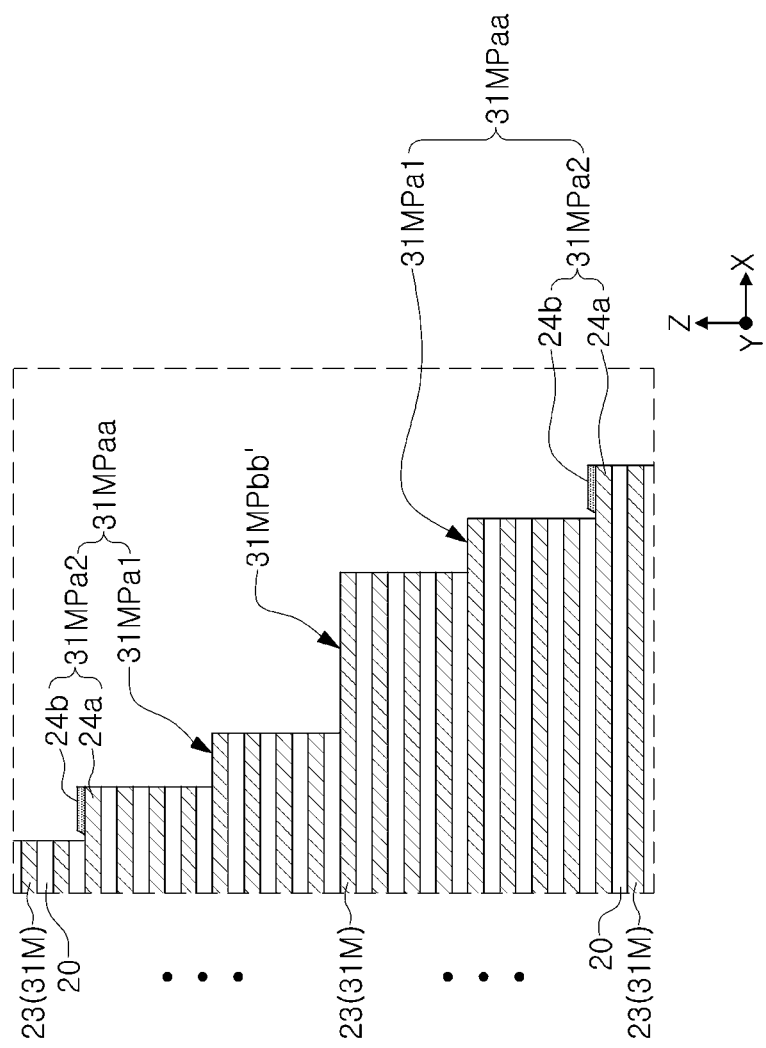
FIG. 17 is an enlarged cross-sectional diagram illustrating another modified example of a semiconductor device according to an example embodiment of the present inventive concepts.
Figure 18:
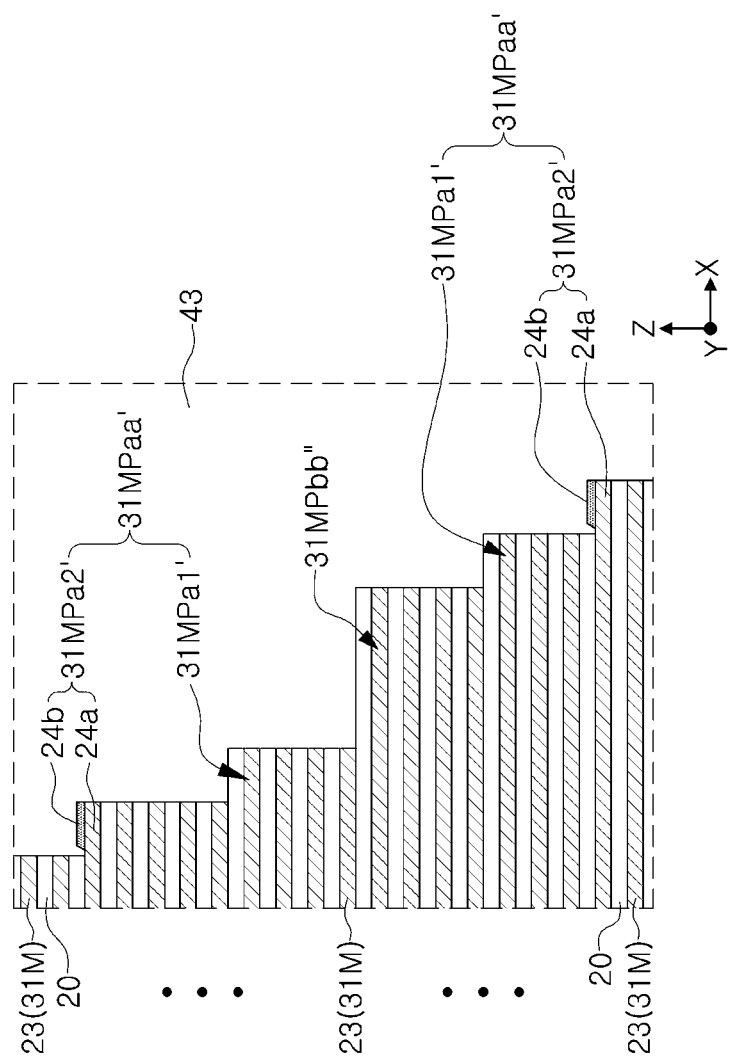
FIG. 18 is an enlarged cross-sectional diagram illustrating another modified example of a semiconductor device according to an example embodiment of the present inventive concepts.

In the description below, modified examples of the first intermediate mold pads 31MPa (in FIG. 4) and the second intermediate mold pad 31MPb (in FIG. 4) will be described with reference to FIGS. 17 and 18. FIGS. 17 and 18 are enlarged diagrams illustrating modified examples of the first intermediate mold pads 31MPa (in FIG. 4) and the second intermediate mold pad 31MPb (in FIG. 4).

In the modified examples, referring to FIG. 17, a second intermediate mold pad 31MPbb' may not have an increased thickness. Each of partial first intermediate mold pads 31MPa1 of first intermediate mold pads 31MPaa adjacent to the second intermediate mold pad 31MPbb' may not have an increased thickness, and each of the other first intermediate mold pads 31MPa2 may have an increased thickness. For example, the first intermediate mold pads 31MPa2 of the first intermediate mold pads 31MPaa, each of which has an increased thickness, may include the mold pad portion 24a and the insulating protrusion portion 24b described in the aforementioned example embodiment, and the first intermediate mold pads 31MPa1 of the first intermediate mold pads 31MPaa, each of which does not have an increased thickness, may only include the mold pad portion 24a and may not include the insulating protrusion portion 24b.

In the modified examples, referring to FIG. 18, a second intermediate mold pad 31MPbb" may not have an increased thickness, each of partial first intermediate mold pads 31MPa1' of the first intermediate mold pads 31MPaa' adjacent to the second intermediate mold pad 31MPbb" may not have an increased thickness, and each of the other first intermediate mold pads 31MPa2' may have an increased thickness.

The first intermediate mold pads 31MPa1', each of which does not have an increased thickness, may be referred to as first thin intermediate mold pads, and the first intermediate mold pads 31MPa2', each of which has an increased thickness, may be referred to as first thick intermediate mold pads.

A difference in height between the first thin intermediate mold pad 31MPa1' of the first intermediate mold pads 31MPaa' disposed at a level higher than a level of the second intermediate mold pad 31MPbb", adjacent to the second intermediate mold pad 31MPbb", and the second intermediate mold pad 31MPbb" may be less than a difference in height between the first thin intermediate mold pad 31MPa1' and the first thick intermediate mold pad 31MPa2'.

A difference in height between the first thin intermediate mold pad 31MPa1' of the first intermediate mold pads 31MPaa' disposed at a level lower than a level of the second intermediate mold pad 31MPbb", adjacent to the second intermediate mold pad 31MPbb", and the second intermediate mold pad 31MPbb" may be greater than a difference in height between the first thin intermediate mold pad 31MPa1' and the first thick intermediate mold pad 31MPa2'.

In some aforementioned example embodiments, each of some of the plurality of intermediate mold pads 31MP may include the mold pad portion 24a and the insulating protrusion portion 24b on the mold pad portion 24a, each of at least some of a plurality of first intermediate mold pads 31MPa may include the mold pad portion 24a and the insulating protrusion portion 24b.

In some aforementioned example embodiments, at least a central region of the second intermediate mold pad 31MPb may not include the insulating protrusion portion 24b. For example, as illustrated in FIG. 4, the central region of the second intermediate mold pad 31MPb may include, and in some embodiments be filled with, the second capping insulating layer 43.

In some example embodiments, a first intermediate mold pad of the plurality of first intermediate mold pads 31MPa, including the mold pad portion 24a and the insulating protrusion portion 24b, may have a first thickness, and in some example embodiments, a central region of the second intermediate mold pad may have a second thickness less than the first thickness. For example, as illustrated in FIG. 13A, the central region of the second intermediate mold pad 31MPb' (in FIG. 13A) may include an insulating material layer having the second thickness less than the first thickness. The insulating material layer of the central region of the second intermediate mold pad 31MPb' (in FIG. 13A) may be a portion of the mold pad portion 24a.

In example embodiments, by providing the stack structure ST including the gate region GA and the insulating region IA, integration density of the semiconductor device may improve.

Figure 19:
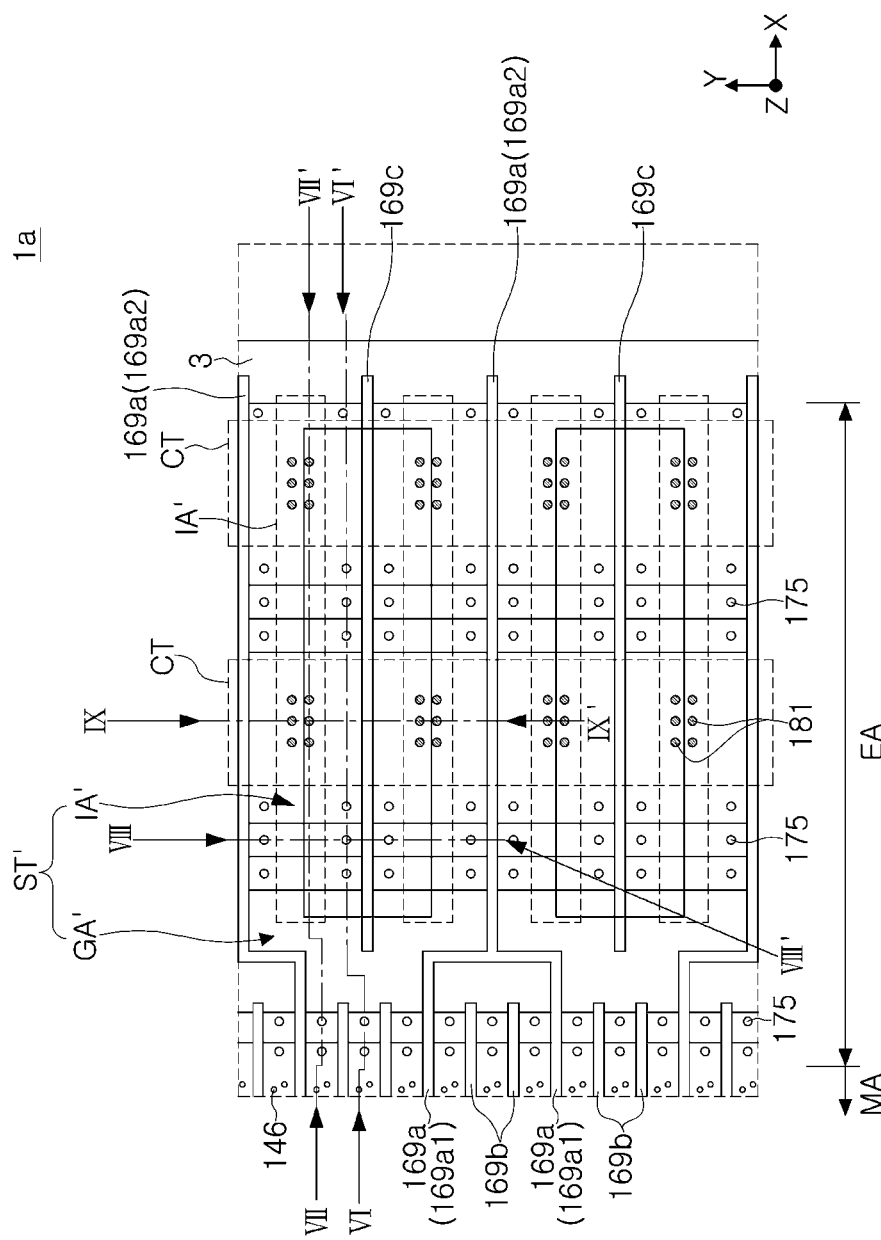
FIG. 19 is an enlarged cross-sectional diagram illustrating another modified example of a semiconductor device according to an example embodiment of the present inventive concepts.
Figure 20A:
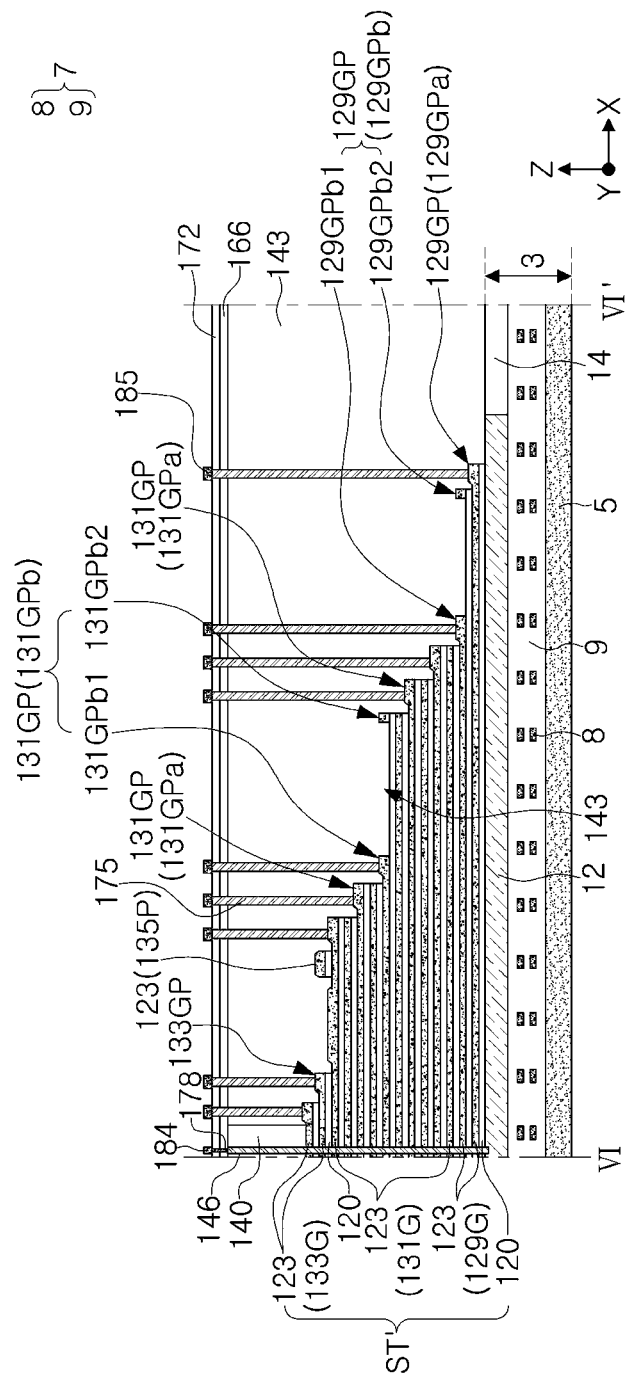
FIGS. 20A to 20C are cross-sectional diagrams illustrating modified examples of a semiconductor device according to an example embodiment of the present inventive concepts.
Figure 20B:
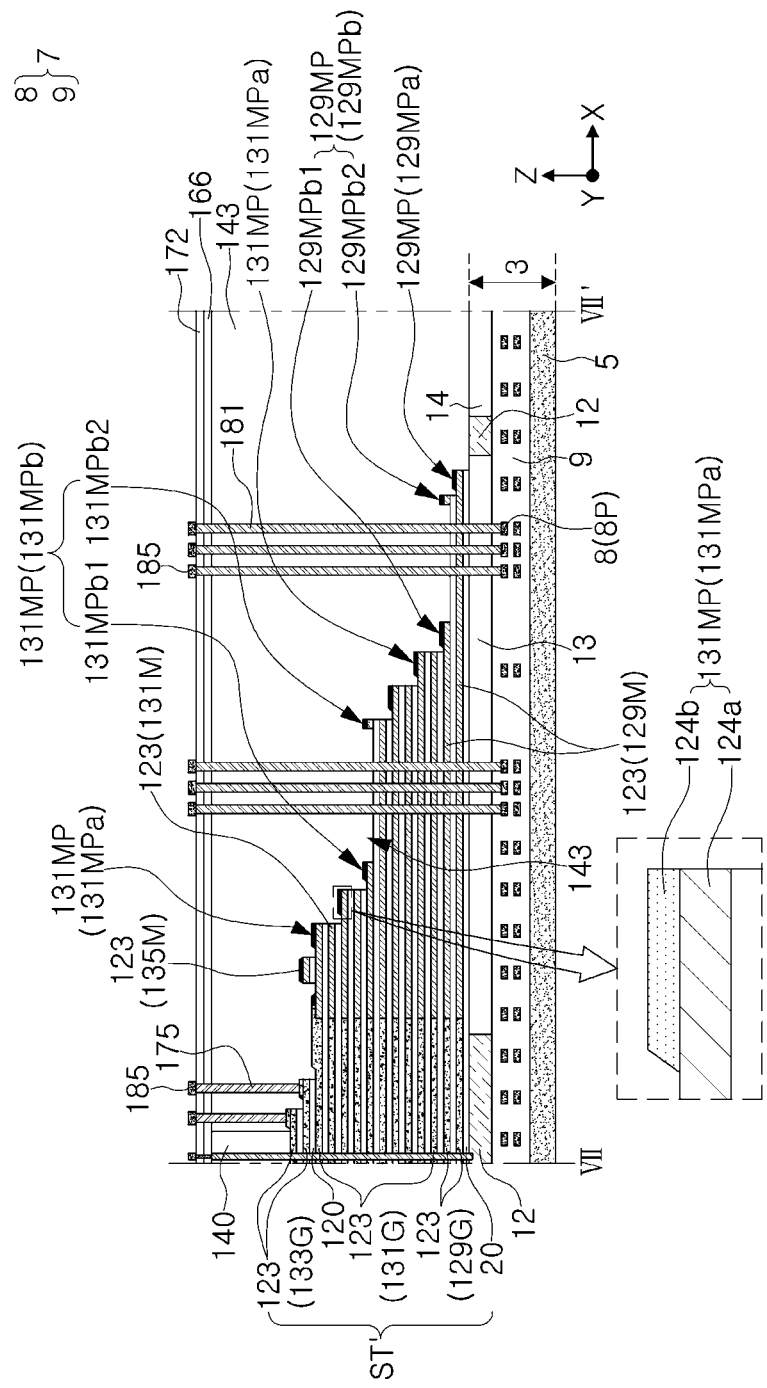
Figure 20C:
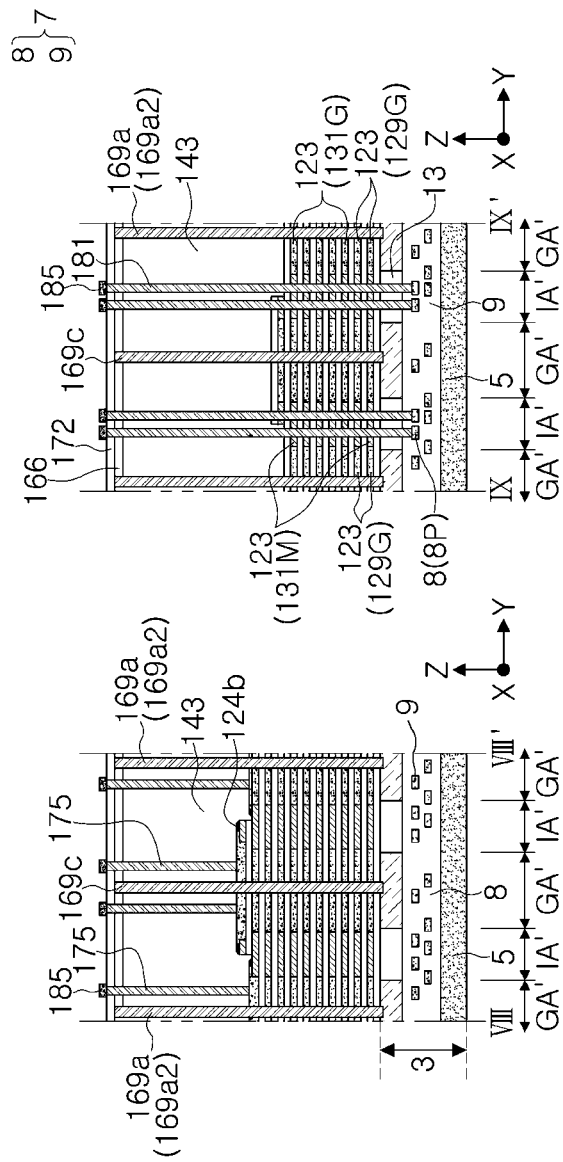

In the description below, a modified example of a semiconductor device 1a will be described with reference to FIGS. 19 to 20C. With regard to FIGS. 19 to 20C, FIG. 19 is a plan diagram illustrating a modified example of a semiconductor device. FIG. 20A is a cross-sectional diagram illustrating a region taken along line VI-VI' in FIG. 19. FIG. 20B is a cross-sectional diagram illustrating a region taken along line VII-VII' in FIG. 19. FIG. 20C is a cross-sectional diagram illustrating regions taken along lines VIII-VIII' and IX-IX'.

Referring to FIGS. 19 to 20C, a lower structure 3 substantially the same as in the aforementioned example embodiment may be disposed. The lower structure 3 may include a lower substrate 5, an upper substrate 12 on the lower substrate 5, a peripheral circuit region 7 between the lower substrate 5 and the upper substrate 12, a gap-fill insulating layer 13 penetrating the lower substrate 5, and an intermediate insulating layer 14 on, and in some embodiments surrounding, a side surface of the lower substrate 5.

A stack structure ST' may be disposed on the lower structure 3. The stack structure ST' may be disposed in a memory cell array region MA and a connection region EA on the lower structure 3. The stack structure ST' may include a gate region GA' and an insulating region IA' which does not include a conductive material.

The gate region GA' may be disposed in the memory cell array region MA and may be disposed in a portion of the connection region EA.

The stack structure ST' may include first layers 120 and second layers 123 alternately stacked on the lower structure 3. The first layers 120 may be disposed in the gate region GA' and the insulating region IA'. The first layers 120 may be configured as interlayer insulating layers.

A first capping insulating layer 140 and a second capping insulating layer 143 may be disposed on the stack structure ST'. The first capping insulating layer 140 may be on, and in some embodiments cover, an uppermost second layer of the second layers 123. The second capping insulating layer 143 may have an upper surface coplanar with an upper surface of the first capping insulating layer 140, and may be on, and in some embodiments cover, a remaining portion of the stack structure ST'.

A plurality of separation structures 169a, 169b, and 169c penetrating the stack structure ST' may be disposed on the lower structure 3. The plurality of separation structures 169a, 169b, and 169c may include first separation structures 169a crossing the memory cell array region MA and the connection region EA, a second separation structure 169b crossing the memory cell array region MA and extending into a portion of the connection region EA, and a third separation structure 169c disposed in a portion of the connection region EA.

Each of the first separation structures 169a may include a pair of first portions 169a1 crossing the memory cell array region MA and extending into a portion of the connection region EA, and a second portion 169a2 connected to the pair of first portions 169a1 and extending in the first direction X in the connection region EA.

The third separation structure 169c may be disposed between the second portions 169a2 of the first separation structures 169a. The second separation structures 169b may be disposed between the first portions 169a1 of the first separation structures 169a.

A distance between a side surface of the third separation structure 169c and a side surface of the second portion 169a2 of each of the first separation structures 169a adjacent to the third separation structure 169c may be greater than a distance between side surfaces of the second separation structure 169b adjacent to each other. A distance between a side surface of the third separation structure 169c and a side surface of the second portion 169a2 of each of the first separation structures 169a adjacent to the third separation structure 169c may be greater than a distance between a side surface of the second separation structure 169b and a side surface of the first portion 169a1 of the first separation structure 169a, adjacent to each other.

The second layers 123 may include gate layers 129G, 131G, 133G, and 135G disposed in the gate region GA' and mold layers 129M, 131M, and 135M disposed in the insulating region IA'. Accordingly, respective ones of the lower and intermediate gate layers 129G and 131G and respective ones of the lower and intermediate mold layers 129M and 131M disposed at the same level in a boundary region between the gate region GA' and the insulating region IA' may oppose each other (e.g., respective ends of the lower and intermediate mold layers 129M and 131M may face respective ends of the lower and intermediate gate layers 129G and 131G).

In an example embodiment, the mold layers 129M, 131M, and 135M may be formed of a material the same as a material of the mold layers 29M, 31M, and 35M illustrated in FIGS. 1 to 12.

In an example embodiment, each of the gate layers 129G, 131G, 133G, and 135G may include a conductive material. For example, each of the gate layers 129G, 131G, 133G, and 135G may be configured as a gate electrode.

The gate layers 129G, 131G, 133G, and 135G may include one or a plurality of lower gate layers 129G, a plurality of intermediate gate layers 131G on the one or the plurality of lower gate layers 129G, a plurality of upper gate layers 133G on the plurality of intermediate gate layers 131G, and a floating gate layer 135G on the plurality of intermediate gate layers 131G.

The mold layers 129M, 131M, and 135M may include one or a plurality of lower mold layers 129M, a plurality of intermediate mold layers 131M on the one or the plurality of lower mold layers 129M, and a floating mold layer 135M on the plurality of intermediate mold layers 131M.

The gate layers 129G, 131G, 133G, and 135G may include a plurality of gate pads arranged in staircase structure, and the mold layers 129M, 131M, and 135M may include a plurality of mold pads arranged in staircase structure. For example, the one or the plurality of lower gate layers 129G may include one or a plurality of lower gate pads 129GP, the plurality of intermediate gate layers 131G may include intermediate gate pads 131GP, and the plurality of upper gate layers 133G may include upper gate pads 133GP. The one or the plurality of lower mold layers 129M may include one or a plurality of lower mold pads 129MP, and the intermediate mold layers 131M may include intermediate mold pads 131MP.

At least one of the lower, intermediate, and upper gate pads 129GP, 131GP, and 133GP may have a thickness greater than a thickness of each of the gate layers 129G, 131G, and 133G. A thickness of each of the gate layers 129G, 131G, and 133G may refer to a thickness of a region of each of the gate layers 129G, 131G, and 133G in which the lower, intermediate, and upper gate pads 129GP, 131GP, and 133GP are not disposed.

At least one of the lower and intermediate mold pads 129MP and 131MP may have a thickness greater than a thickness of each of the gate layers 129G, 131G, and 133G.

In some embodiments, at least one of the lower and intermediate mold pads 129MP and 131MP may have a thickness greater than a thickness of each of the mold layers 129M and 133M. A thickness of each of the mold layers 129M and 133M may refer to a thickness of a region of each of the mold layers 129M and 133M in which the lower and intermediate mold pads 129MP and 133MP are not disposed.

The intermediate gate pads 131GP may include first intermediate gate pads 131GPa formed of a material the same as a material of the first intermediate gate pads 31GPa (in FIG. 6) illustrated in FIG. 6 and having a structure the same as a structure of each of the first intermediate gate pads 31GPa, and may include a second intermediate gate pad 131GPb formed of a material the same as a material of the second intermediate gate pad 31GPb (in FIG. 6) illustrated in FIG. 6 and having a structure the same as a structure of the second intermediate gate pad 31GPb. The second intermediate gate pad 131GPb may include a first portion 131GPb1 and a second portion 131GPb2 spaced apart from each other as in the example embodiment illustrated in FIG. 6, and a central region of the second intermediate gate pad 131GPb between the first portion 131GPb1 and the second portion 131GPb2 may be filled with the second capping insulating layer 143.

The lower gate pads 129GP may include first lower gate pads 129GPa formed of a material the same as a material of the first lower gate pads 29GPa (in FIG. 5) illustrated in FIG. 5 and having a structure the same as a structure of each of the first lower gate pads 29GPa, and may include a second lower gate pad 129GPb formed of a material the same as a material of the second lower gate pad 29GPb (in FIG. 5) illustrated in FIG. 5 and having a structure the same as a structure of the second lower gate pad 29GPb. The second lower gate pad 129GPb may include a first portion 129GPb1 and a second portion 129GPb2 spaced apart from each other as in the example embodiment illustrated in FIG. 5, and a central region of the second lower gate pad 129GPb between the first portion 129GPb1 and the second portion 129GPb2 may be filled with the second capping insulating layer 143.

The intermediate mold pads 131MP may include first intermediate mold pads 131MPa formed of a material the same as a material of the first intermediate mold pads 31MPa (in FIG. 4) illustrated in FIG. 4 and having a structure the same as a structure of each of the first intermediate mold pads 31MPa, and may include a second intermediate mold pad 131MPb formed of a material the same as a material of the second intermediate mold pad 31MPb (in FIG. 4) illustrated in FIG. 4 and having a structure the same as a structure of the second intermediate mold pad 31MPb. For example, each of the first intermediate mold pads 131MPa may include a mold pad portion 124a and an insulating protrusion portion 124b on the mold pad portion 124a. The second intermediate mold pad 131MPb may include a first portion 131MPb1 and a second portion 131MPb2 spaced apart from each other as in the example embodiment illustrated in FIG. 4. A central region of the second intermediate mold pad 131MPb may not include the insulating protrusion portion 124b. For example, the central region of the second intermediate mold pad 131MPb between the first portion 131MPb1 and the second portion 131MPb2 may be filled with the second capping insulating layer 143.

The lower mold pads 129MP may include a first lower mold pads 129MPa and a second lower mold pad 129MPb. The second lower mold pad 129MPb may be adjacent to the intermediate mold pads 131MP, and may include a first portion 129MPb1 and a second portion 129MPb2 spaced apart from each other. A central region of the second lower mold pad 129MPb may not include the insulating protrusion portion 124b. For example, the central region of the second lower mold pad 129MPb between the first portion 129MPb1 and the second portion 129MPb2 may be filled with the second capping insulating layer 143.

In FIG. 19, a reference numeral "CT" may refer to a central region of the second intermediate mold pad 131MPb, a central region of the second intermediate gate pad 131GPb, a central region of the second lower mold pad 129MPb, and a central region of the second lower gate pad 129GPb.

A first upper insulating layer 166 and a second upper insulating layer 172 stacked in order on the first capping insulating layer 140 and the second capping insulating layer 143 may be disposed. The first to third separation structures 169a, 169b, and 169c may penetrate the stack structure ST', may extend upwardly, and may penetrate the first and second capping insulating layers 140 and 143 and the first upper insulating layer 166.

Bit line contact plugs 178 penetrating the first upper insulating layer 166 and the second upper insulating layer 172 and electrically connected to the memory cell vertical structure 146 may be disposed.

In the connection region EA, gate contact structures 175 penetrating the first upper insulating layer 166 and a second upper insulating layer 172, extending downwardly, and electrically connected to the lower, intermediate, and upper gate pads 129GP, 131GP, and 133GP may be disposed.

Peripheral contact structures 181 in contact with peripheral pad portions 8P of the peripheral wirings 8, extending upwardly, and penetrating the gap-fill insulating layer 113 and the insulating region IA' of the stack structure ST' may be disposed.

Gate connection wirings 185 may be disposed on the gate contact structures 175 and the peripheral contact structures 181.

Bit lines 184 may be disposed on the bit line contact plugs 178.

Figure 21:
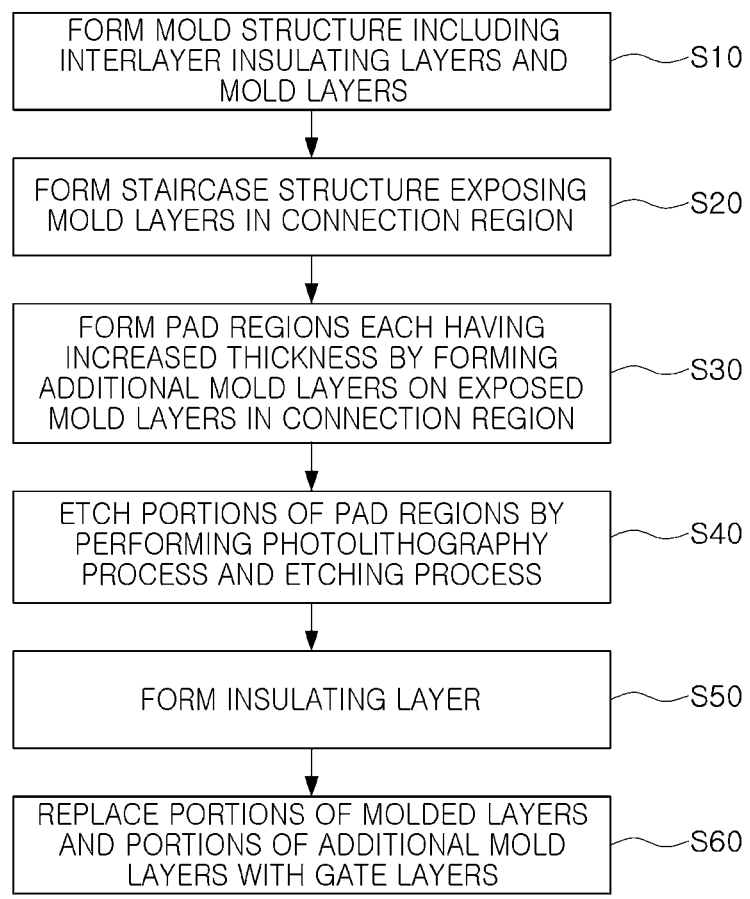
FIG. 21 is a flowchart illustrating an example of a method of manufacturing a semiconductor device according to an example embodiment of the present inventive concepts.
Figure 22A:
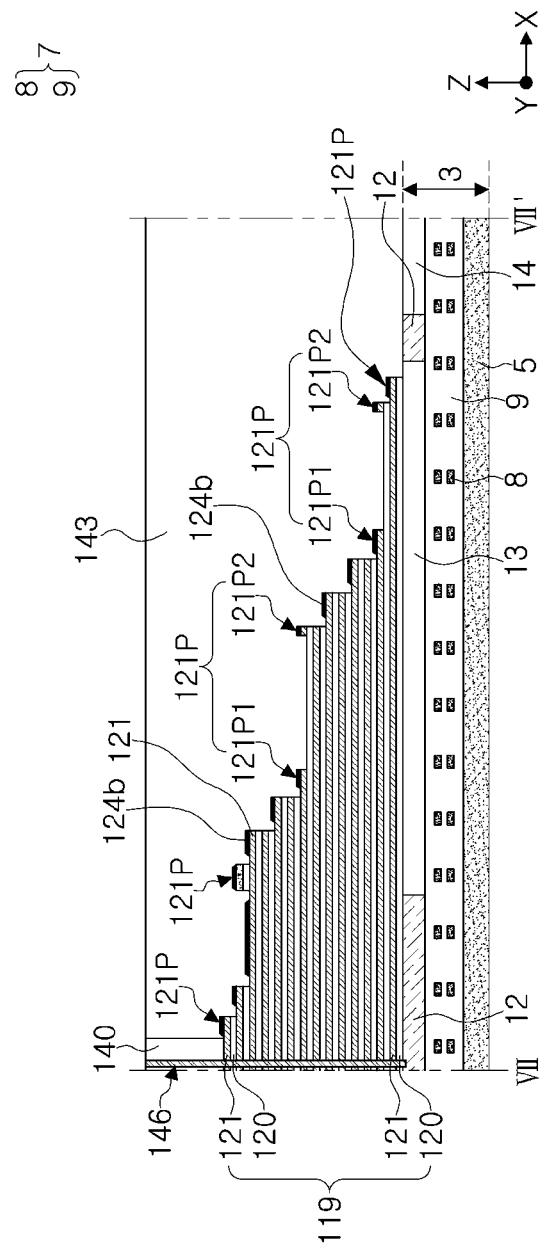
FIGS. 22A to 23B are cross-sectional diagrams illustrating an example of a method of manufacturing a semiconductor device according to an example embodiment of the present inventive concepts.
Figure 22B:
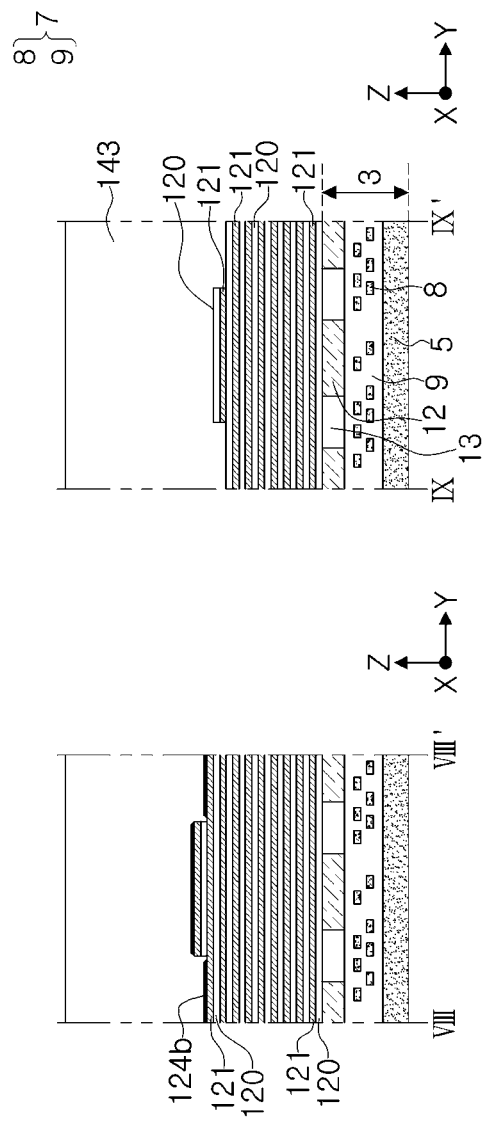
Figure 23A:
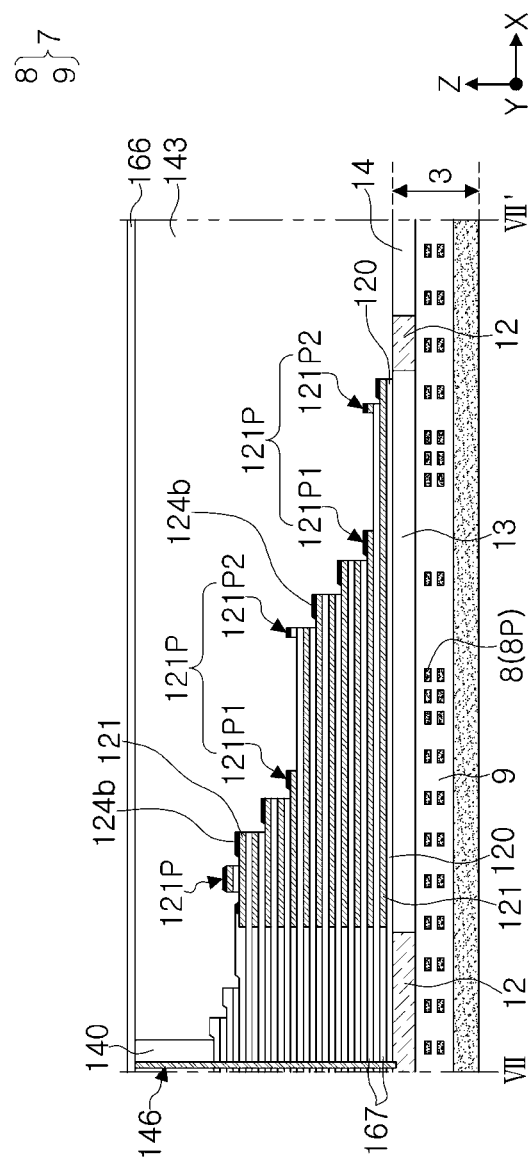
Figure 23B:
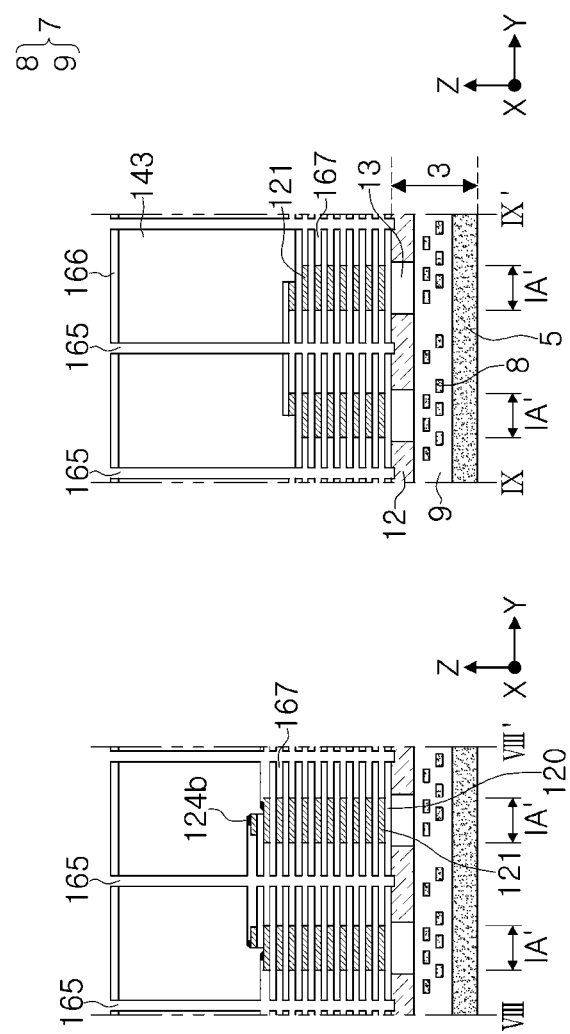

In the description below, an example of a method of manufacturing a semiconductor device will be described with reference to FIGS. 21, and 22A to 23B. FIG. 21 is a flowchart illustrating a method of manufacturing a semiconductor device according to an example embodiment of the present inventive concepts. FIGS. 22A to 23B are cross-sectional diagrams illustrating an example of a method of manufacturing a semiconductor device according to an example embodiment of the present inventive concepts. FIGS. 22A and 23A are cross-sectional diagrams illustrating a region taken along line VII-VII' in FIG. 19, and FIGS. 22B and 23B are cross-sectional diagrams illustrating regions taken along lines VIII-VIII' and IX-IX' in FIG. 19.

Referring to FIGS. 19, 21, 22A, and 22B, a mold structure 119 including insulating layers 120 and mold layers 121 may be formed on a lower structure 3 (S10). The insulating layers 120 may be formed of silicon oxide, and the mold layers 121 may be formed of silicon nitride. The insulating layers 120 and the mold layers 121 may be alternately stacked.

The lower structure 3 may include a lower substrate 5, an upper substrate 12 on the lower substrate 5, a peripheral circuit region 7 between the lower substrate 5 and the upper substrate 12, a gap-fill insulating layer 13 penetrating the lower substrate 5, an intermediate insulating layer 14 an, and in some embodiments surrounding, a side surface of the lower substrate 5.

The mold structure 119 may be formed in a memory cell array region MA and a connection region EA on the lower structure 3.

In the connection region EA, a staircase structure exposing the mold layers 121 may be formed (S20). For example, a staircase structure may be formed by patterning the insulating layers 120 and the mold layers 121, and the mold layers 121 may be exposed by the staircase structure. Forms of the staircase structure may not be limited to the example illustrated in the diagrams, and may be varied. For example, the staircase structure may be configured as the staircase structure of the stack structure ST illustrated in FIGS. 1 to 12.

In the connection region EA, pad regions 121P each having an increased thickness may be formed by forming additional mold layers 124b on the exposed mold layers 121 (S30).

By performing a photolithography process and an etching process, portions of the pad regions 121P may be etched (S40).

In an example embodiment, each of the etched partial pad regions may have a length in the first direction X, greater than a length of each of the other pad regions in the first direction X. The etched partial pad regions may be divided into a first portion 121P1 and a second portion 121P2.

In an example embodiment, the etching the portions of the pad regions 121P may include removing the additional mold layer and the mold layer of the etched pad region.

In another example embodiment, the etching the portions of the pad regions 121P may include removing only the additional mold layer and leaving the mold layer of the etched pad region.

Capping insulating layers 140 and 143 on, and in some embodiments covering, the mold structure 119 may be formed. The capping insulating layers 140 and 143 may include a first capping insulating layer 140 formed before forming the staircase structure, and a second capping insulating layer 143 formed after forming the staircase structure. A memory cell vertical structure 146 penetrating the first capping insulating layer 140 and the mold structure 119 may be formed. The memory cell vertical structure 146 may have a structure the same as a structure of the memory cell vertical structure 46 (in FIG. 12) illustrated in FIG. 12.

Referring to FIGS. 20A to 20C along with FIGS. 19, 21, 23A and 23B, an insulating layer 166 may be formed (S50). For example, a first upper insulating layer 166 may be formed on the first and second capping insulating layers 140 and 143. Separation trenches 165 penetrating the first upper insulating layer 166, the first and second capping insulating layers 140 and 143, and the mold structure 119 (in FIG. 22A) in order may be formed.

Portions of the mold layers 121 and portions of the additional mold layers 124b may be replaced with the gate layers 129G, 131G, 133G, and 135G (in FIGS. 20A to 20C) (S60).

The replacing portions of the mold layers 121 and portions of the additional mold layers 124b with the gate layers 129G, 131G, 133G, and 135G (in FIGS. 20A to 20C) may include forming empty spaces 167 by partially etching the mold layers 121 and the additional mold layers 124b, exposed by the separation trenches 165, and forming the gate layers 129G, 131G, 133G, and 135G (in FIGS. 20A to 20C) in the empty spaces 167.

The remaining mold layers 121 (in FIGS. 23A and 23B) and the remaining first upper insulating layer 166 may be included in the mold layers 129M, 131M, and 135M described in the aforementioned example embodiment with reference to FIGS. 20A and 20B.

Referring to FIGS. 19 and 20A to 20C, separation structures 169a, 169b, and 169c (in FIG. 20C) filling the separation trenches 165 (in FIG. 23B) may be formed. A second upper insulating layer 172 may be formed on the first upper insulating layer 166.

Bit line contact plugs 178 penetrating the first and second upper insulating layers 166 and 172 and electrically connected to the memory cell vertical structure 146 may be formed.

Gate contact structures 175 penetrating the first and second upper insulating layers 166 and 172, extending downwardly, and electrically connected to the gate pads 129GP, 131GP, and 133GP of the gate layers 129G, 131G, 133G, and 135G (in FIGS. 20A to 20C) may be formed.

The peripheral contact structures 181 penetrating the insulating region IA' (in FIG. 19) including the mold layers 129M, 131M, and 135M and electrically connected to peripheral pad portions 8P of peripheral wirings 8 of the peripheral circuit region 7 of the lower structure 3 may be formed.

A bit line 184 may be formed on the bit line contact plug 178.

Gate connection wirings 185 may be formed on the gate contact structures 175 and the peripheral contact structures 181.

According to the aforementioned example embodiments, by providing the stack structure including the gate region and the insulating region on the lower structure including the peripheral circuit region, integration density of the semiconductor may improve.

While the example embodiments have been shown and described above, it will be apparent to those skilled in the art that modifications and variations could be made without departing from the scope of the present inventive concepts as defined by the appended claims.

What is claimed is:

1. A semiconductor device, comprising:
a lower structure comprising a lower substrate, an upper substrate on the lower substrate, and a peripheral circuit region between the lower substrate and the upper substrate;
a stack structure in a memory cell array region on the lower structure and extending into a connection region on the lower structure, wherein the stack structure comprises a gate region and a first insulating region, wherein the gate region is in the memory cell array region and extends into the connection region, and wherein the first insulating region is in the connection region;
a capping insulating layer on the stack structure; and
a memory cell vertical structure in the gate region in the memory cell array region,
wherein the stack structure comprises a plurality of first layers and a plurality of second layers alternately stacked on the lower structure,
wherein the plurality of second layers comprise a plurality of gate layers in the gate region, a plurality of mold layers in the first insulating region, a plurality of gate portions extending from the plurality of gate layers in the connection region, and a plurality of mold portions extending from at least one of the mold layers in the connection region,
wherein the plurality of gate portions and the plurality of mold portions have a staircase structure in the connection region,
wherein each of the plurality of gate layers comprises a conductive material,
wherein each of the plurality of mold layers comprises an insulating material,
wherein the plurality of mold layers comprise one or more lower mold layers, and a plurality of intermediate mold layers on the one or more lower mold layers,
wherein the plurality of mold portions comprises a first intermediate mold portion and a second intermediate mold portion,
wherein at least one of the first intermediate mold portion and the second intermediate mold portion comprises a mold pad portion and an insulating protrusion portion on the mold pad portion, and
wherein at least a central region of the first intermediate mold portion does not comprise the insulating protrusion portion.

2. The semiconductor device of claim 1, wherein the second intermediate mold portion comprises the mold pad portion and the insulating protrusion portion, and wherein the second intermediate mold portion is at a different level than the first intermediate mold portion.

3. The semiconductor device of claim 1, wherein a thickness of the second intermediate mold portion is greater than a thickness of each of the plurality of intermediate mold layers.

4. The semiconductor device of claim 1, wherein the first intermediate mold portion comprises a first portion and a second portion spaced apart from each other in a first direction,
wherein the first portion and the second portion of the first intermediate mold portion comprises the mold pad portion and the insulating protrusion portion,
wherein a length of the first portion of the first intermediate mold portion in the first direction is greater than a length of the second portion of the first intermediate mold portion in the first direction,
wherein the mold pad portion comprises a same material as a material of the plurality of intermediate mold layers, and has a same thickness as a thickness of each of the plurality of intermediate mold layers,
wherein the mold pad portion comprises a first insulating material, and
wherein the insulating protrusion portion comprises a second insulating material, the second insulating material having an etching speed higher than an etching speed of the first insulating material.

5. The semiconductor device of claim 1, further comprising:
a plurality of peripheral contact structures penetrating the first insulating region; and
a plurality of gate contact structures electrically connected to the plurality of gate portions,
wherein the plurality of gate layers comprise one or more lower gate layers, a plurality of intermediate gate layers on the one or more lower gate layers, and a plurality of upper gate layers on the plurality of intermediate gate layers,
wherein the plurality of gate pads comprise a plurality of upper gate pads extending from the plurality of upper gate layers, a plurality of intermediate gate pads extending from the plurality of intermediate gate layers, and one or more lower gate pads extending from the one or more lower gate layers,
wherein each of the plurality of intermediate gate pads has a first thickness greater than a second thickness of each of the plurality of gate layers, and
wherein an uppermost gate pad among the plurality of upper gate pads has the second thickness.

6. The semiconductor device of claim 1, further comprising:
a plurality of separation structures penetrating the stack structure,
wherein the stack structure further comprises a second insulating region, and
wherein a portion of the gate region is between the first insulating region and the second insulating region.

7. A semiconductor device, comprising:
a lower structure;
a stack structure in a memory cell array region on the lower structure and extending into a connection region on the lower structure, wherein the stack structure comprises a gate region and an insulating region in the connection region; and
a memory cell vertical structure penetrating the gate region in the memory cell array region,
wherein the stack structure comprises a plurality of first layers and a plurality of second layers alternately stacked on the lower structure,
wherein the gate region in the connection region comprises a first gate pad region and a second gate pad region,
wherein the insulating region is between the first gate pad region and the second gate pad region,
wherein the plurality of second layers comprise a plurality of gate portions in the first and second gate pad regions, and a plurality of mold portions in the insulating region,
wherein the plurality of gate portions and the plurality of mold portions have a staircase structure in the connection region,
wherein the plurality of mold portions comprise a first mold portion, wherein at least one mold portion of the plurality of mold portions comprises a mold pad portion and an insulating protrusion portion on the mold pad portion, and wherein a central region of the first mold portion does not include the insulating protrusion portion.

8. The semiconductor device of claim 7, wherein the plurality of mold portions further comprise a second mold portion, and wherein at least a central region of the second mold portion comprises the mold pad portion and the insulating protrusion portion.

9. The semiconductor device of claim 7, wherein the first mold portion comprises a first edge region and a second edge region, wherein the central region of the first mold portion is between the first edge region and the second edge region, and wherein each of the first edge region and the second edge region of the first mold portion comprises the mold pad portion and the insulating protrusion portion.

10. The semiconductor device of claim 9, wherein a length of the first edge region in a first direction is greater than a length of the second edge region in the first direction.

11. The semiconductor device of claim 10, wherein a length of the central region in the first direction is greater than the length of the first edge region in the first direction.

12. The semiconductor device of claim 7, wherein the plurality of gate portions comprise a plurality of intermediate gate pads and a plurality of upper gate pads on the plurality of intermediate gate pads, wherein an uppermost gate pad among the plurality of upper gate pads has a first thickness, wherein each of the plurality of intermediate gate pads has a second thickness, and wherein the second thickness is greater than the first thickness.

13. The semiconductor device of claim 7, wherein the first layers comprise interlayer insulating layers, and wherein a material of the interlayer insulating layers is different from a material of the plurality of mold portions.

14. The semiconductor device of claim 7, wherein the mold pad portion comprises a first insulating material, and wherein the insulating protrusion portion comprises a second insulating material different from the first insulating material.

15. The semiconductor device of claim 14, wherein the second insulating material has an etching speed higher than an etching speed of the first insulating material.

16. The semiconductor device of claim 7, further comprising:

a plurality of peripheral contact structures penetrating the insulating region in the connection region; and a plurality of gate contact structures electrically connected to the plurality of gate portions in the first and second gate pad regions, wherein at least one of the plurality of peripheral contact structures penetrates through the central region of the first mold portion.

17. A semiconductor device, comprising:

a lower structure;

a stack structure in a memory cell array region on the lower structure and extending into a connection region on the lower structure, wherein the stack structure comprises a gate region and an insulating region in the connection region;

a memory cell vertical structure penetrating the stack structure in the memory cell array region; and a capping insulating layer on the stack structure, wherein the stack structure comprises a plurality of first layers and a plurality of second layers alternately stacked on the lower structure, wherein the plurality of first layers comprise interlayer insulating layers, wherein the plurality of second layers comprise a plurality of gate portions in the gate region, and a plurality of mold portions in the insulating region, wherein the plurality of gate portions and the plurality of mold portions have a staircase structure in the connection region, wherein the plurality of gate portions comprise a intermediate gate portion and an uppermost gate portion, wherein a thickness of the uppermost gate portion is greater than a thickness of the intermediate gate portion, wherein the plurality of mold portions comprise a first mold portion, wherein the first mold portion comprises a first mold pad portion and a first insulating protrusion portion on the first mold pad portion, wherein at least a portion of an edge region of the first mold portion comprises the first mold pad portion and the first insulating protrusion portion, and wherein a central region of the first mold portion does not include the first insulating protrusion portion.

18. The semiconductor device of claim 17, wherein the gate region in the connection region comprises a first gate region and a second gate region, and wherein the insulating region is between the first gate region and the second gate region.

19. The semiconductor device of claim 17, wherein the plurality of mold portions further comprise a second mold portion, wherein at least a central region of the second mold portion comprises a second mold pad portion and a second insulating protrusion portion on the second mold pad portion, wherein the second mold pad portion comprises a same material as the first mold pad portion, and wherein the second insulating protrusion portion comprises a same material as the first insulating protrusion portion.

20. The semiconductor device of claim 18, further comprising:

a plurality of peripheral contact structures penetrating the insulating region in the connection region; and a plurality of gate contact structures electrically connected to the plurality of gate portions in the first and second gate regions, wherein at least one of the plurality of peripheral contact structures penetrates through the central region of the first mold portion and is spaced apart from the first insulating protrusion portion.

* * * * *